United States Patent
Chiang et al.

(10) Patent No.: US 10,566,299 B2
(45) Date of Patent: Feb. 18, 2020

(54) METHOD FOR MANUFACTURING A MULTI-BAND ANTENNA PACKAGE STRUCTURE

(71) Applicant: NATIONAL CHUNG SHAN INSTITUTE OF SCIENCE AND TECHNOLOGY, Taoyuan (TW)

(72) Inventors: Ching-Wen Chiang, Chiayi (TW); Yen-Cheng Kuan, Kaohsiung (TW); Chia-Jen Liang, Kaohsiung (TW); Chien-Te Yu, Taoyuan (TW)

(73) Assignee: NATIONAL CHUNG SHAN INSTITUTE OF SCIENCE AND TECHNOLOGY (TW)

( * ) Notice: Subject to any disclaimer, the term of this patent is extended or adjusted under 35 U.S.C. 154(b) by 0 days.

(21) Appl. No.: 16/504,539

(22) Filed: Jul. 8, 2019

(65) Prior Publication Data

US 2019/0333883 A1 Oct. 31, 2019

Related U.S. Application Data

(62) Division of application No. 15/846,966, filed on Dec. 19, 2017, now Pat. No. 10,424,550.

(51) Int. Cl.
*H01L 23/66* (2006.01)
*H01L 23/538* (2006.01)
(Continued)

(52) U.S. Cl.
CPC .......... *H01L 23/66* (2013.01); *H01L 21/486* (2013.01); *H01L 21/4853* (2013.01);
(Continued)

(58) Field of Classification Search
CPC .......... H01L 2223/6677; H01L 23/66; H01L 23/49827; H01L 23/5226; H01L 2924/1421
See application file for complete search history.

(56) References Cited

U.S. PATENT DOCUMENTS 6,680,754 B1  1/2004 Yim
9,608,334 B2  3/2017 Spella
(Continued)

FOREIGN PATENT DOCUMENTS

EP     3 171 403 A2    5/2017
KR     1020120130643   2/2012
(Continued)

OTHER PUBLICATIONS

Ka Fai Chang—77-GHz Automotive Radar Sensor System with Antenna Integrated Package; IEEE Transactions on Components, Packaging and Manufacturing Technology, vol. 4, No. 2, Feb. 2014.
(Continued)

*Primary Examiner* — Ngan V Ngo
(74) *Attorney, Agent, or Firm* — Schmeiser, Olsen & Watts, LLP

(57) ABSTRACT

Method for manufacturing a multi-band antenna package structure includes providing a first temporary substrate; forming a first dielectric material layer, and first metal patterns; forming at least one metal via; forming at least one metal pillar, and disposing an integrated circuit chip; forming a molding layer; thinning down the molding layer thus forming an integrated circuit chip layer; forming a first redistribution layer; forming a first antenna unit layer; forming a first protection layer, thus a first stacked structure formed; removing the first temporary substrate, and facing down the first stacked structure to adhere it on a second temporary substrate with a second glue layer; forming a second redistribution layer; forming a second protection layer; forming bump balls, thus a second stacked structure formed; removing the second temporary substrate with the second glue layer, facing down and mounting the second stacked structure on a substrate through the bump balls.

5 Claims, 30 Drawing Sheets

(51) Int. Cl.
  *H01L 23/31* (2006.01)
  *H01L 23/552* (2006.01)
  *H01L 21/683* (2006.01)
  *H01L 21/56* (2006.01)
  *H01L 21/48* (2006.01)
  *H01Q 1/22* (2006.01)
  *H01L 23/522* (2006.01)
  *H01L 23/498* (2006.01)
  *H01Q 21/28* (2006.01)
  *H01Q 1/52* (2006.01)
  *H01L 23/00* (2006.01)
  *H01Q 1/24* (2006.01)

(52) U.S. Cl.
  CPC ........ *H01L 21/4857* (2013.01); *H01L 21/565* (2013.01); *H01L 21/568* (2013.01); *H01L 21/6835* (2013.01); *H01L 23/3128* (2013.01); *H01L 23/49827* (2013.01); *H01L 23/5226* (2013.01); *H01L 23/5383* (2013.01); *H01L 23/5386* (2013.01); *H01L 23/5389* (2013.01); *H01L 23/552* (2013.01); *H01Q 1/2283* (2013.01); *H01Q 21/28* (2013.01); *H01L 24/19* (2013.01); *H01L 24/20* (2013.01); *H01L 2221/68345* (2013.01); *H01L 2221/68359* (2013.01); *H01L 2223/6677* (2013.01); *H01L 2223/6688* (2013.01); *H01L 2224/16235* (2013.01); *H01L 2224/221* (2013.01); *H01L 2224/32225* (2013.01); *H01L 2224/73204* (2013.01); *H01L 2224/73253* (2013.01); *H01L 2224/81005* (2013.01); *H01L 2924/1421* (2013.01); *H01L 2924/1533* (2013.01); *H01L 2924/15311* (2013.01); *H01L 2924/3025* (2013.01); *H01Q 1/247* (2013.01); *H01Q 1/526* (2013.01)

(56) References Cited

U.S. PATENT DOCUMENTS

| | | |
|---|---|---|
| 10,096,558 B1 | 10/2018 | Chiang |
| 2006/0049995 A1 | 3/2006 | Imaoka et al. |
| 2014/0168014 A1 | 6/2014 | Chih |
| 2014/0293529 A1* | 10/2014 | Nair ............... H01Q 1/2291 361/679.31 |
| 2014/0319684 A1 | 10/2014 | Suzuki et al. |
| 2016/0276325 A1 | 9/2016 | Nair |
| 2017/0345761 A1 | 11/2017 | Yu et al. |
| 2018/0166405 A1 | 6/2018 | Chiang |
| 2018/0191053 A1 | 7/2018 | Ndip |
| 2018/0247905 A1 | 8/2018 | Yu |
| 2018/0269139 A1 | 9/2018 | Chiang |
| 2018/0277489 A1 | 9/2018 | Han |
| 2019/0006252 A1* | 1/2019 | Akkinepally ........ H01L 23/13 |
| 2019/0089044 A1* | 3/2019 | Kobuke ............. H01L 23/15 |
| 2019/0139912 A1* | 5/2019 | Kim ................. H01L 23/66 |
| 2019/0273030 A1* | 9/2019 | Lim ............... H01L 23/3675 |
| 2019/0341363 A1* | 11/2019 | Yu ................. H01L 23/552 |

FOREIGN PATENT DOCUMENTS

| | | |
|---|---|---|
| KR | 1020130005811 | 1/2013 |
| KR | 1020160067961 | 6/2016 |
| WO | WO2016056387 A1 | 4/2016 |

OTHER PUBLICATIONS

Restriction Requirement dated Jun. 20, 2018 for U.S. Appl. No. 15/846,966.

Notice of Allowance dated Apr. 9, 2019 for U.S. Appl. No. 15/846,966.

* cited by examiner

METHOD FOR MANUFACTURING A MULTI-BAND ANTENNA PACKAGE STRUCTURE

CROSS-REFERENCE TO RELATED APPLICATION

This application is a divisional patent application of U.S. application Ser. No. 15/846,966 filed on Dec. 19, 2017, the entire contents of which are hereby incorporated by reference for which priority is claimed under 35 U.S.C. § 121.

BACKGROUND OF THE INVENTION

1. Field of the Invention

The present disclosure relates to a multi-band antenna, and in particular to a multi-band antenna package structure, a manufacturing method of the multi-band antenna package structure and a communication device using the multi-band antenna package structure.

2. Description of the Related Art

The antenna is an important component of the communication device, which can radiate the radio frequency signal. One prior connection manner for electrically connecting an antenna system (i.e. front-end) with a chip system (i.e. back-end) is wire-bonding, wherein the antennae comprise an antenna disposed on a substrate and another one antenna disposed on a chip. However, the wire-bonding not only significantly causes power consumption the radio frequency signal, but also occupies a large space due to the electrode pads for obtaining high quality input/output.

To reduce the usage of the wire-bonding, a design for integrating an antenna in a package structure has been disclosed by a published paper (Ka Fai Chang, Rui Li, Cheng Jin, Tech Guan Lim, Soon Wee Ho, How Yuan Hwang, and Boyu Zheng, "77-GHz Automotive Radar Sensor with Antenna Integrated Package", IEEE Transactions on Components, Packaging and Manufacturing Technology, Vol. 4, No. 2, February 2014). However, the package structure is not a stacked package structure which electrically connects a multi-band antenna with a system, and compared with the current advance manufacturing process, the manufacturing process of the package structure is not steady, such as, shapes of the through mold compound vias are discordant, and non-contact joints occur due to the effect of the warpage.

BRIEF SUMMARY OF THE INVENTION

An objective of the present disclosure is to provide a multi-band antenna package structure which is light, thin and small without occupying a large space.

Another objective of the present disclosure is to provide a multi-band antenna package structure which can solve the interferences of different frequency bands, such as adjacent channel interference.

Another one objective of the present disclosure is to provide a method for manufacturing the above multi-band antenna package structure.

Another one objective of the present disclosure is to provide a communication device using the above multi-band antenna package structure, such that the communication device can receive a first frequency signal and outputs a second frequency signal which conveys message information of the first frequency signal. The communication device can be a frequency conversion device or an encrypted communication device, such that the eavesdropper cannot eavesdrop the message information of the first frequency signal.

To achieve at least the above objective, the present disclosure provides a multi-band antenna package structure, comprising: a first redistribution layer, comprising a first dielectric material layer and first metal patterns formed in openings of the first dielectric material layer; an integrated circuit layer, formed on the first redistribution layer, comprising at least one metal via, at least one metal pillar, an integrated circuit chip, and a molding layer, wherein the molding layer is used to fill openings formed by the metal via, the metal pillar and the integrated circuit chip which are disposed on the first redistribution layer, the metal via is electrically connected to one of the first metal patterns, and the metal pillar is electrically connected to the integrated circuit chip and one of the first metal patterns; a second redistribution layer, formed on the integrated circuit layer, comprising a second dielectric material layer and second metal patterns formed in openings of the second dielectric material layer, wherein the metal via is electrically connected to one of the second metal patterns; and a first antenna unit layer, comprising a first dielectric layer and third metal patterns formed in openings of the first dielectric layer, wherein at least one of the third metal patterns is electrically connected to one of the second metal patterns, and the third metal patterns form a first antenna unit.

In one embodiment of the present disclosure, the integrated circuit chip comprises a second antenna unit disposed on an integrated circuit of the integrated circuit chip.

In one embodiment of the present disclosure, the multi-band antenna package structure further comprises: a first shielding layer, formed between the first antenna unit layer and the second redistribution layer, comprising a second dielectric layer and fourth metal patterns formed in openings of the second dielectric layer, wherein the fourth metal patterns are electrically connected to the third metal patterns and portions of the second metal patterns.

In one embodiment of the present disclosure, the multi-band antenna package structure further comprises: a first protection layer, wherein the first redistribution layer is disposed on the first protection layer; a second protection layer, formed on the first antenna unit layer; and bump balls, wherein the multi-band antenna package structure is mounted on a substrate through the bump balls.

In one embodiment of the present disclosure, the first antenna unit is a multiple input multiple output phase antenna.

In one embodiment of the present disclosure, the integrated circuit chip has a height the same as that of the metal via, or alternatively less than that of the metal via.

In one embodiment of the present disclosure, the multi-band antenna package structure further comprises: a second antenna unit layer, comprising a second dielectric layer and fourth metal patterns formed in openings of the second dielectric layer, wherein at least one of the fourth metal patterns is electrically connected to one of the first metal patterns, the fourth metal patterns form a second antenna unit, and the first redistribution layer is formed on the second antenna unit layer.

In one embodiment of the present disclosure, the multi-band antenna package structure further comprises: a first shielding layer, formed between the first antenna unit layer and the second redistribution layer, comprising a third dielectric layer and fifth metal patterns formed in openings of the third dielectric layer, wherein the fifth metal patterns are electrically connected to the third metal patterns and portions of the second metal patterns; and a second shielding layer, formed between the second antenna layer and the first redistribution layer, comprising a fourth dielectric layer and sixth metal patterns formed in openings of the fourth dielectric layer, wherein the sixth metal patterns are electrically connected to the fourth metal patterns and portions of the first metal patterns.

In one embodiment of the present disclosure, the multi-band antenna package structure further comprises: a first protection layer, wherein the first redistribution layer is disposed on the first protection layer; a second protection layer, formed on the first antenna unit layer; and bump balls, wherein the multi-band antenna package structure is mounted on a substrate through the bump balls.

In one embodiment of the present disclosure, the second antenna unit is a multiple input multiple output phase antenna.

To achieve at least the above objective, the present disclosure provides a method for manufacturing a multi-band antenna package structure, comprising: providing a first temporary substrate with a first glue layer; forming a first dielectric material layer on the first glue layer, and forming first metal patterns in openings of the first dielectric material layer; forming at least one metal via on one of the first metal patterns; forming at least one metal pillar on portions of the first metal patterns, and disposing an integrated circuit chip on the metal pillar; a molding layer is formed to cover the metal pillar, the metal via and the integrated circuit chip; thinning down the molding layer to expose the metal via, so as to form an integrated circuit chip layer comprising the molding layer, the metal via, the metal pillar and the integrated circuit chip; forming a first redistribution layer on the integrated circuit chip layer, wherein the first redistribution layer comprises a second dielectric material layer and second metal patterns, wherein the second patterns are formed in opening of the second dielectric material layer; forming a first antenna unit layer on the first redistribution layer, wherein the first antenna unit layer comprises a first dielectric layer and third metal patterns formed in openings of the first dielectric layer, wherein at least one of the third metal patterns is electrically connected to one of the second metal patterns, and the third metal patterns form a first antenna unit; forming a first protection layer on the first antenna unit layer, such that a first stacked structure is formed; removing the first temporary substrate with the first glue layer, and facing down the first stacked structure to adhere the first stacked structure on a second temporary substrate with a second glue layer; forming a second redistribution layer by processing the first dielectric material layer and the first metal patterns, wherein the second redistribution layer comprising the processed first dielectric material layer and the processed first metal patterns; forming a second protection layer on the second redistribution layer; forming bump balls on the second protection layer, such that a second stacked structure is formed; and removing the second temporary substrate with the second glue layer, facing down the second stacked structure, and mounting the second stacked structure on a substrate through the bump balls.

In one embodiment of the present disclosure, the integrated circuit chip comprises a second antenna unit on an integrated circuit of the integrated circuit chip.

In one embodiment of the present disclosure, the method for manufacturing a multi-band antenna package structure further comprises: before the first antenna unit layer is formed, forming a first shielding layer on the first redistribution layer, wherein the first shielding layer comprises a second dielectric layer and fourth metal patterns formed in openings of the second dielectric layer, wherein the fourth metal patterns are electrically connected to the third metal patterns and portions of the second metal patterns.

In one embodiment of the present disclosure, the method for manufacturing a multi-band antenna package structure further comprises: before the second protection layer is formed, forming a second antenna unit layer on the second redistribution layer, wherein the second antenna unit layer comprises a second dielectric layer and fourth metal patterns formed in openings of the second dielectric layer, wherein at least one of the fourth metal patterns is electrically connected to one of the first metal patterns, and the fourth metal patterns form a first antenna unit.

In one embodiment of the present disclosure, the method for manufacturing a multi-band antenna package structure further comprises: before the first antenna unit layer is formed, forming a first shielding layer on the first redistribution layer, wherein the first shielding layer comprises a third dielectric layer and fifth metal patterns formed in openings of the third dielectric layer, wherein the fifth metal patterns are electrically connected to the third metal patterns and portions of the second metal patterns; and before the second antenna unit layer is formed, forming a second shielding layer on the second redistribution layer, wherein the second shielding layer comprises a fourth dielectric layer and sixth metal patterns formed in openings of the fourth dielectric layer, wherein the sixth metal patterns are electrically connected to the fourth metal patterns and portions of the first metal patterns.

To achieve at least the above objective, the present disclosure provides a communication device, comprising: a multi-band antenna package structure, comprising: a first redistribution layer, comprising a first dielectric material layer and first metal patterns formed in openings of the first dielectric material layer; an integrated circuit layer, formed on the first redistribution layer, comprising at least one metal via, at least one metal pillar, an integrated circuit chip, and a molding layer, wherein the molding layer is used to fill openings formed by the metal via, the metal pillar and the integrated circuit chip which are disposed on the first redistribution layer, the metal via is electrically connected to one of the first metal patterns, and the metal pillar is electrically connected to the integrated circuit chip and one of the first metal patterns; a second redistribution layer, formed on the integrated circuit layer, comprising a second dielectric material layer and second metal patterns formed in openings of the second dielectric material layer, wherein the metal via is electrically connected to one of the second metal patterns; and a first antenna unit layer, comprising a first dielectric layer and third metal patterns formed in openings of the first dielectric layer, wherein at least one of the third metal patterns is electrically connected to one of the second metal patterns, and the third metal patterns form a first antenna unit; wherein the integrated circuit is a processing circuit, and the integrated circuit chip has a second antenna unit on the integrated circuit, or alternatively the integrated circuit chip does not have the second antenna unit, but the multi-band antenna package structure further comprises: a second antenna unit layer, comprising a second dielectric layer and fourth metal patterns formed in openings of the second dielectric layer, wherein at least one of the fourth metal patterns is electrically connected to one of the first metal patterns, the fourth metal patterns form a second antenna unit, and the first redistribution layer is formed on the second antenna unit layer.

In one embodiment of the present disclosure, the communication device is an encrypted communication device or a frequency conversion device.

In summary, the above multi-band antenna package structure can have advantages of high cost efficiency, high flexibility, high scalability, small volume, thin thickness and light weight, and be used to implement the communication device, such as a frequency conversion device or an encrypted communication device.

DETAILED DESCRIPTION OF THE INVENTION

To make it easier for the examiner to understand the objects, characteristics and effects of this present disclosure, embodiments together with the attached drawings for the detailed description of the present disclosure are provided.

The 5$^{th}$ generation (5G) mobile communication system has technical characteristics of a heterogeneous network, a multiple input multiple output (MIMO) and beamforming control and an adoption of microwave. The 5G mobile communication system adopt a channel for a multi-mode module which supports three frequency bands. Furthermore, the three-dimensional integrated circuit (3D IC) stacked package technique has been developed well, and the development of the heterogeneous integration and micro-system is very important.

Accordingly, the present disclosure provides a multi-band antenna package structure which can integrate the radio frequency chip (having logic circuits and memories) and the antenna unit(s) in a stacked structure, so as to have advantages of high cost efficiency, high flexibility, high scalability, small volume, thin thickness and light weight. Moreover, the antenna unit can be designed for elimination of different frequency band interferences, and be the antenna array for beamforming.

Figure 1:
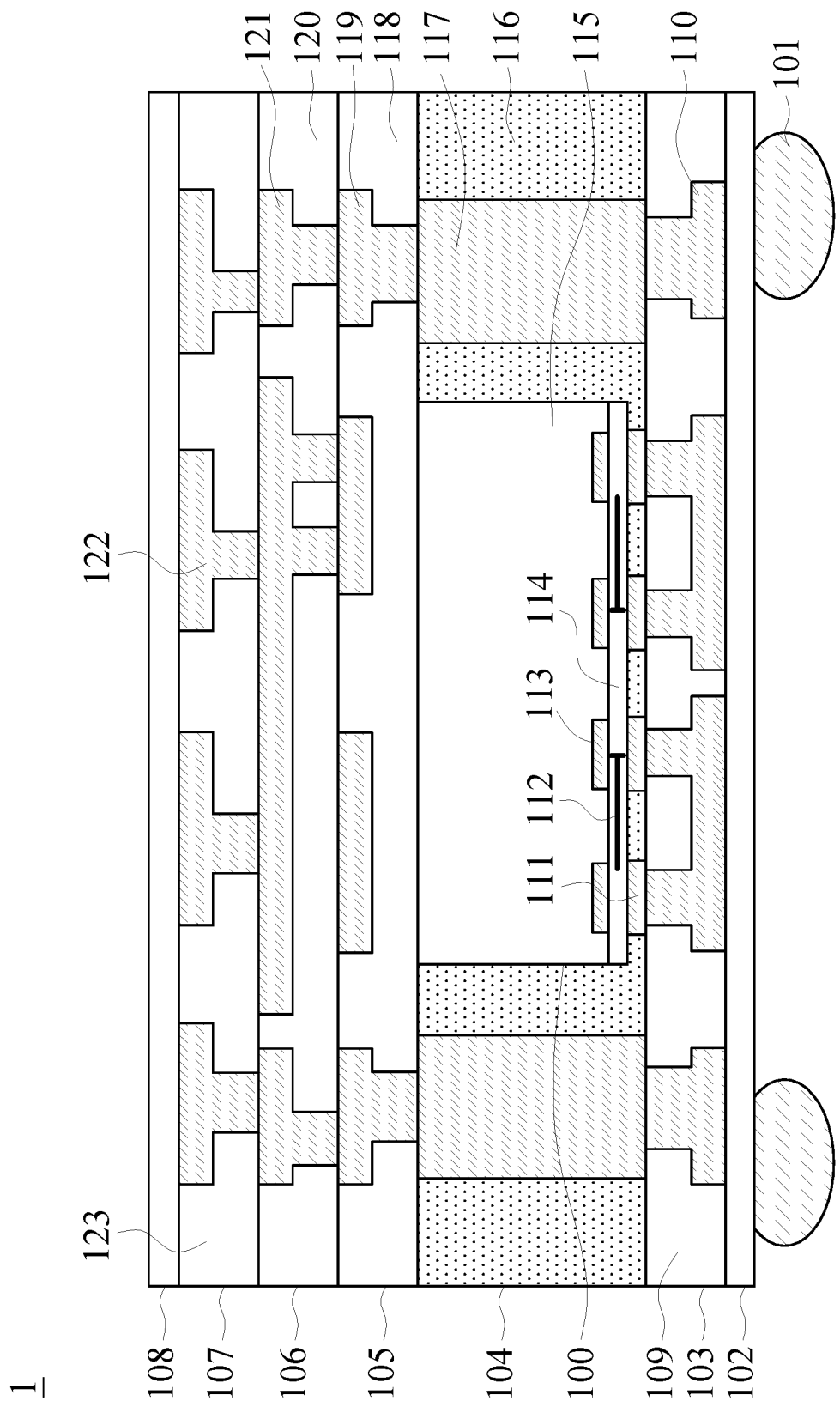
FIG. 1 is a section view of a multi-band antenna package structure according to one embodiment of the present disclosure.

Referring to FIG. 1, FIG. 1 is a section view of a multi-band antenna package structure according to one embodiment of the present disclosure. The multi-band antenna package structure 1 integrates an antenna unit (comprising antennae formed by a plurality of metal patterns 122) and an integrated circuit chip 100, such that being a 3D IC stacked package structure to have advantages of high cost efficiency, high flexibility, high scalability, small volume, thin thickness and light weight. The multi-band antenna package structure 1 can be further mounted on a substrate through a plurality of bump balls 101, such as C4 bumps.

Specifically, the multi-band antenna package structure 1 comprises protection layers 102, 108, redistribution layers 103, 105, a shielding layer 106, an antenna unit layer 107 and an integrated circuit layer 104. The redistribution layer 103 is disposed on the protection layer 102. The protection layer 102 is a passivation layer, such as a silicon oxide (SiO$_2$) layer or a silicon nitride (Si$_3$N$_4$) layer, and the present disclosure does not limit the material of the passivation layer.

The redistribution layer 103 is formed by plurality of metal patterns 110 and a dielectric material layer 109, wherein the metal patterns 110 are disposed in the openings of the dielectric material layer 109. The metal patterns 110 can be made of copper (Cu), gold (Au), silver (Ag) or titanium (Ti), and the present disclosure is not limited thereto. The dielectric material layer 109 can be the photo resistor or polymer layer, such a polyimide (PI) dielectric material layer or a polybenzoxazole (PBO) dielectric material layer, and the present disclosure is not limited to.

The integrated circuit layer 104 is disposed on the redistribution layer 103, the integrated circuit layer 104 comprises at least one of metal vias 117, metal pillars 111, a molding layer 116 and an integrated chip 100. The molding layer 116 is used to fill a plurality of openings formed by the integrated circuit chip 100, the metal pillars 111 and the metal vias 117. The integrated circuit chip 100 is disposed between the metal vias 117 and on the metal pillars 111, and the present disclosure is not limited thereto.

The integrated circuit chip 100 comprises the electrode pads 113, an integrated circuit 114, an antenna unit 112, and a semiconductor material 115. The integrated circuit 114 and the electrode pads 113 can be covered by the semiconductor material 115. Portions of the metal patterns 110 of the redistribution layer 103 are electrically connected to the metal vias 117, and other portions of the metal patterns 110 of the redistribution layer 103 are electrically connected to electrode pads 113 of the integrated circuit chip 100 through the metal pillars 111. The antenna unit 112 is disposed on the integrated circuit 114, such that the antenna unit 112 has an antenna on chip scheme, and the antenna 112 can be the antenna array for the beamforming.

In the embodiment of the present disclosure, a height of the integrated circuit chip 100 is the same as those of the metal vias 117, and the present disclosure is not limited thereto. The metal vias 117, the metal pillars 111, the antenna unit 112 and the electrode pads 113 can be made of copper (Cu), gold (Au), silver (Ag) or titanium (Ti), and the present disclosure is not limited thereto. The molding layer 116 is made of molding compound or molded underfill (MUF), and the present disclosure is not limited thereto. The semiconductor material 115 can be silicon (Si) or group III/V, such as Si wafer or Si substrate, and the present disclosure is not limited thereto.

The redistribution layer 105 is disposed on the integrated circuit layer 00. The redistribution layer 105 is formed by plurality of metal patterns 119 and a dielectric material layer 118, wherein the metal patterns 119 are disposed in the openings of the dielectric material layer 118. Portions of the metal patterns 119 are electrically connected to the metal vias 117. The metal patterns 119 can be made of copper (Cu), gold (Au), silver (Ag) or titanium (Ti), and the present disclosure is not limited thereto. The dielectric material layer 118 can be a polyimide (PI) dielectric material layer or a polybenzoxazole (PBO) dielectric material layer, and the present disclosure is not limited to.

The shielding layer 106 is disposed on the redistribution layer 105. The shielding layer 106 is formed by plurality of metal patterns 121 and a dielectric layer 120, wherein the metal patterns 121 are disposed in the openings of the dielectric layer 120. The metal patterns 121 are electrically connected to portions of the metal patterns 119, and are grounded to achieve shielding. The metal patterns 121 can be made of copper (Cu), gold (Au), silver (Ag) or titanium (Ti), and the present disclosure is not limited thereto. The dielectric layer 120 can be a polyimide (PI) layer or a polybenzoxazole (PBO) layer, a dielectric material layer or other dielectric layer, such as formed by chemical vapor deposition (CVD), and the present disclosure is not limited to.

The antenna unit layer 107 is disposed on the shielding layer 106. The antenna unit layer 107 is formed by plurality of metal patterns 122 and a dielectric layer 123, wherein the metal patterns 122 are disposed in the openings of the dielectric layer 123. The metal patterns 122 are electrically connected to the metal patterns 121. The metal patterns 122 form the antenna unit of the antenna unit layer 107, and can be a planar antenna array for the beamforming, such as a multiple input multiple output (MIMO) phase antenna.

The metal patterns 122 can be made of copper (Cu), gold (Au), silver (Ag) or titanium (Ti), and the present disclosure is not limited thereto. The dielectric layer 123 can be a polyimide (PI) layer or a polybenzoxazole (PBO) layer, a dielectric material layer or other dielectric layer, such as formed by chemical vapor deposition (CVD), and the present disclosure is not limited to.

The protection layer 108 is formed on the antenna unit layer 107. The protection layer 108 is a passivation layer, such as a silicon oxide (SiO$_2$) layer or a silicon nitride (Si$_3$N$_4$) layer, and the present disclosure does not limit the material of the passivation layer.

In the embodiment, the antenna unit 112 and the antenna unit formed by the metal patterns 122 are packaged to form a system in package (SiP) being miniaturized, wherein one antenna unit 112 is disposed in the integrated circuit chip 100, and other one antenna unit formed by the metal patterns 122 is disposed above the integrated circuit chip 100. The antenna unit 112 radiates a first frequency signal at a first frequency, and the antenna unit formed by the metal patterns 122 second frequency signal at a second frequency. Since the higher the frequency is, the smaller the antenna size is, the first and second frequencies are respectively 60 GHz and 28-38 GHz for example. Furthermore, the antenna unit 112 and the antenna units formed by the metal patterns 122 are packaged on two sides of the integrated circuit chip 100, and elimination of different frequency band interferences can be achieved.

It is noted that the integrated circuit 114 can be any type of processing circuit, such as the circuit comprising a filter, a modulator, a demodulator, an amplifier, an encoder, a decoder, an encryption circuit, a decryption circuit and so on. Furthermore, being dependent on actual application, the integrated circuit chip 100 may not have the antenna unit 112.

Figure 2:
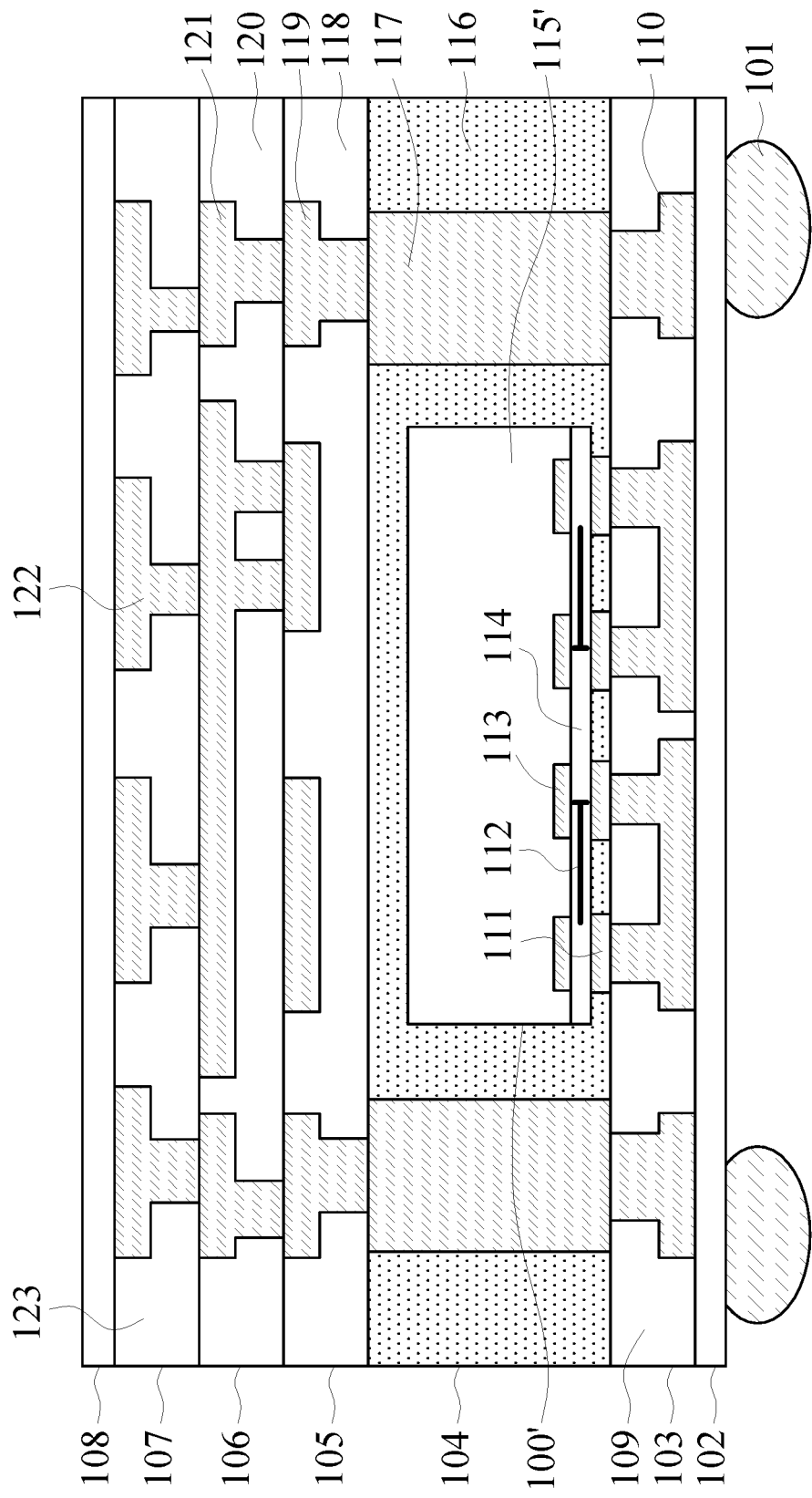
FIG. 2 is a section view of a multi-band antenna package structure according to another one embodiment of the present disclosure.

Moreover, the height of the integrated circuit chip 100 is not limited to be the same as the height of the metal vias 117. Referring to FIG. 2, FIG. 2 is a section view of a multi-band antenna package structure according to another one embodiment of the present disclosure. The difference between the multi-band antenna package structures 1 and 2 is that the integrated circuit chip 100' (or the semiconductor material 115') has a height lower than the height of the metal vias 117 and the molding layer 116 covers the integrated circuit chip 100'.

Figure 3:
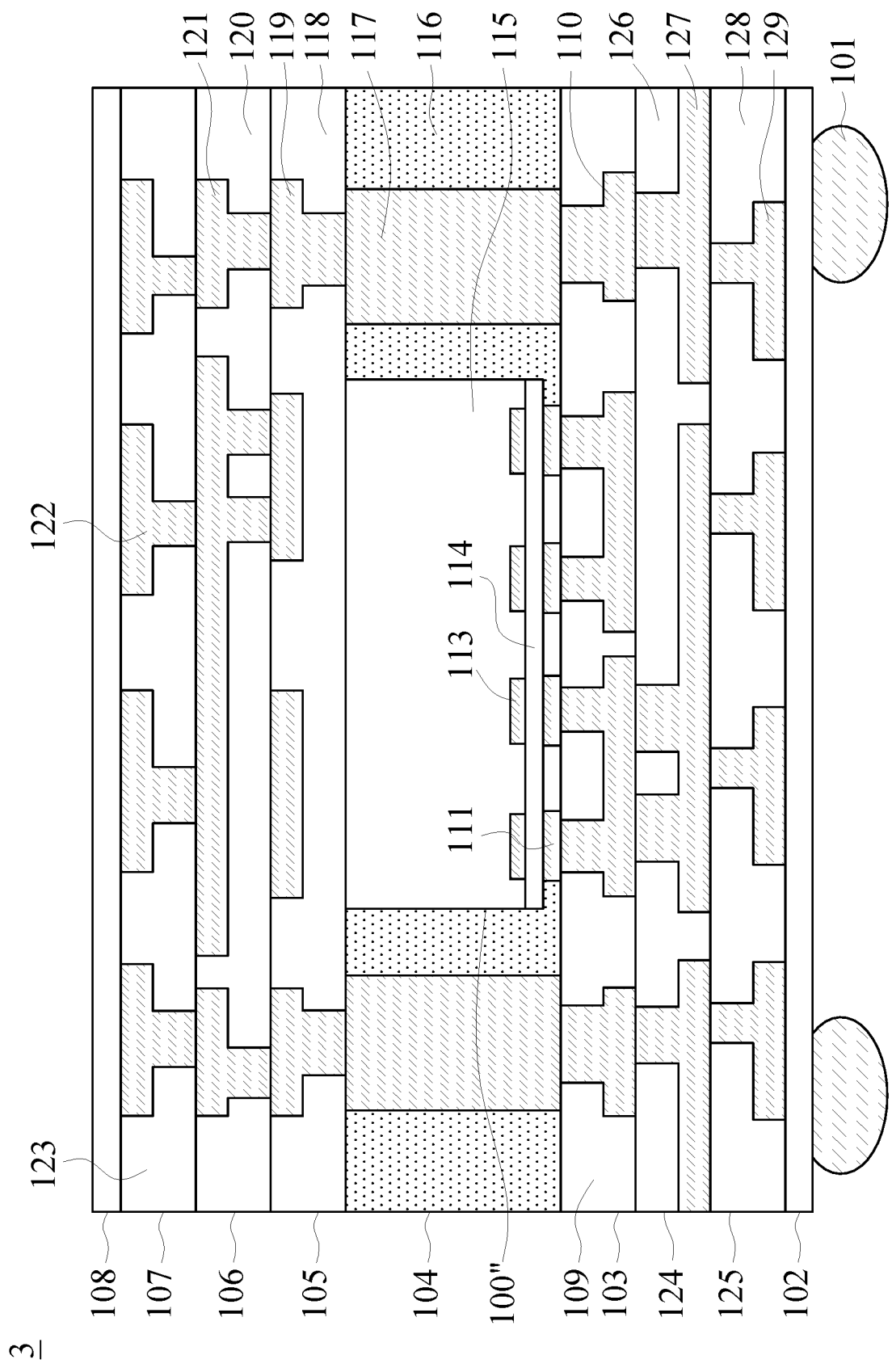
FIG. 3 is a section view of a multi-band antenna package structure according to another one embodiment of the present disclosure.

In some situation, the integrated circuit chip may not have the antenna unit, and the actual application demands the multi-band frequency operation. Thus, the present disclosure also provides a multi-band antenna package structure with two antenna unit layers. Referring to FIG. 3, FIG. 3 is a section view of a multi-band antenna package structure according to another one embodiment of the present disclosure. The multi-band antenna package structure 3 can be further mounted on a substrate through a plurality of bump balls 101, such as C4 bumps.

Specifically, the multi-band antenna package structure 3 comprises protection layers 102, 108, redistribution layers 103, 105, shielding layers 124, 106, antenna unit layers 125, 107 and an integrated circuit layer 104. The antenna unit layer 125 is disposed on the protection layer 102, and details of the protection layer 102 is illustrated above, thus omitting the redundant descriptions.

The antenna unit layer 125 is disposed on the protection layer 102. The antenna unit layer 125 is formed by plurality of metal patterns 129 and a dielectric layer 128, wherein the metal patterns 129 are disposed in the openings of the dielectric layer 128. The metal patterns 129 form the antenna unit of the antenna unit layer 125, and can be a planar antenna array for the beamforming, such as a multiple input multiple output (MIMO) phase antenna.

The shielding layer 124 is disposed on the antenna unit layer 125. The shielding layer 124 is formed by plurality of metal patterns 127 and a dielectric layer 126, wherein the metal patterns 127 are disposed in the openings of the dielectric layer 126. The metal patterns 127 are electrically connected to the metal patterns 129 which form the antenna unit of the antenna unit layer 125. The metal patterns 127 can be grounded to achieve shielding.

The metal patterns 127 and 129 can be made of copper (Cu), gold (Au), silver (Ag) or titanium (Ti), and the present disclosure is not limited thereto. The dielectric layers 126 and 128 can be a polyimide (PI) layer or a polybenzoxazole (PBO) layer, a dielectric material layer or other dielectric layer, such as formed by chemical vapor deposition (CVD), and the present disclosure is not limited to.

The redistribution layer 103 is disposed on the shielding layer 124 and formed by plurality of metal patterns 110 and a dielectric material layer 109. Portions of the metal patterns 110 are electrically connected to the metal patterns 127 of the shield layer 124. Details of the redistribution layer 103 have been illustrated in the above embodiment of FIG. 1, thus omitting the redundant descriptions.

The integrated circuit layer 104 is disposed on the redistribution layer 103, the integrated circuit layer 104 comprises at least one of metal vias 117, metal pillars 111, a molding layer 116 and an integrated chip 100". It is noted that the integrated chip 100" does not have the antenna unit thereon or therein. Other details of the integrated circuit layer 104 and the integrated chip 100" have been illustrated in the above embodiment of FIG. 1, thus omitting the redundant descriptions.

The redistribution layer 105 is disposed on the integrated circuit layer 100, the shielding layer 106 is disposed on the redistribution layer 105, the antenna unit layer 107 is disposed on the shielding layer 106, and the protection layer 108 is formed on the antenna unit layer 107. Details of the redistribution layer 105, the shielding layer 106, the antenna unit layer 107 and the protection layer 108 have been illustrated in the above embodiment of FIG. 1, thus omitting the redundant descriptions.

In the embodiment, the antenna units respectively formed by the metal patterns 122 and 129 are packaged to form a system in package (SiP) being miniaturized. The antenna units respectively formed by the metal patterns 122 and 129 radiates a first and second frequency signals at a first and second frequencies. The first and second frequencies are respectively 60 GHz and 28-38 GHz for example. Furthermore, the antenna units formed by the metal patterns 122 and 129 are packaged on two sides of the integrated circuit chip 100, and the elimination of different frequency band interferences can be achieved.

Additionally, the height of the integrated circuit chip 100" is not limited to be the same as the height of the metal vias 117. In other one embodiment, the integrated circuit chip 100" has a height lower than the height of the metal vias 117 and the molding layer 116 covers the integrated circuit chip 100".

Figure 4A:
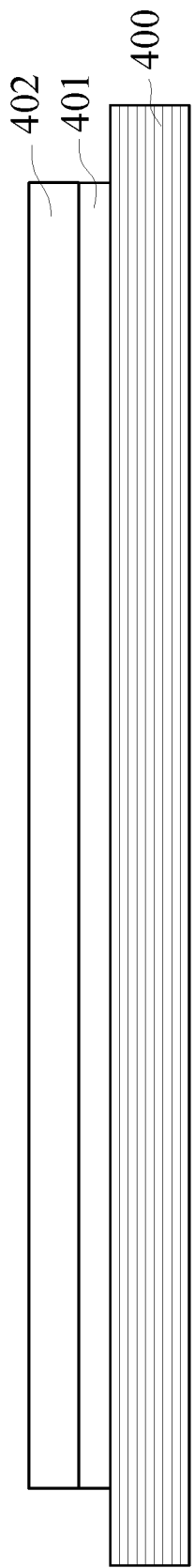
FIG. 4A is a product section view of a step of a method for manufacturing a multi-band antenna package structure according to one embodiment of the present disclosure.

Furthermore, a method for manufacturing the multi-band antenna package structures 1 of FIG. 1 is illustrated as follows. Referring to FIG. 4A through FIG. 4O, FIG. 4A through FIG. 4O are product section views of steps of a method for manufacturing a multi-band antenna package structure according to one embodiment of the present disclosure. Firstly, in FIG. 4A, a temporary carrier substrate 400 with a glue layer 401 is provided, and a dielectric material layer 402 is adhered on the temporary carrier substrate 400 through a glue layer 401, wherein the temporary carrier substrate 400 can be a Si or glass substrate, and the present disclosure is not limited thereto.

Figure 4B:
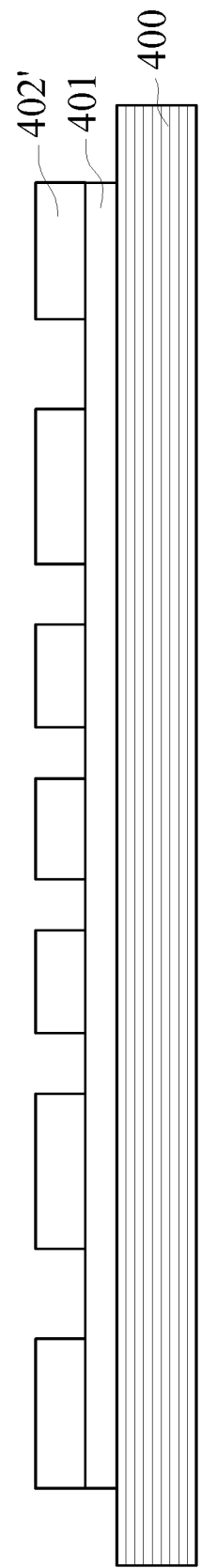
FIG. 4B is a product section view of a step of a method for manufacturing a multi-band antenna package structure according to one embodiment of the present disclosure.
Figure 4C:
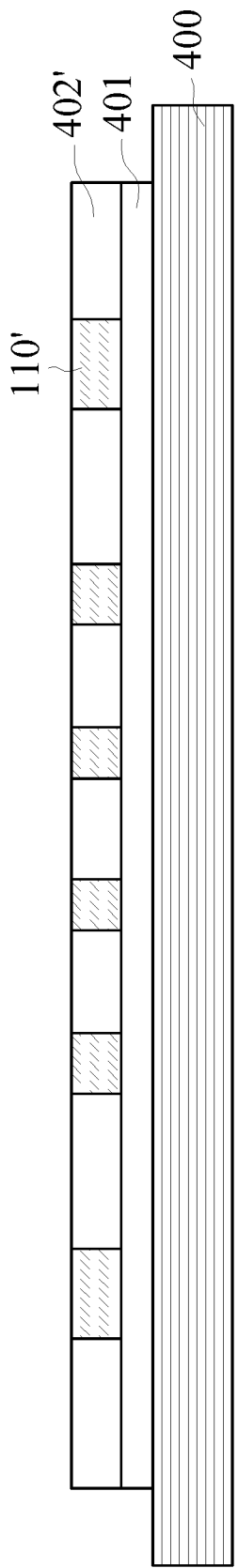
FIG. 4C is a product section view of a step of a method for manufacturing a multi-band antenna package structure according to one embodiment of the present disclosure.

Next, in FIG. 4B, the dielectric material layer 402' is formed on the glue layer 401 by coating, and a patterning process is performed by exposure and development to form a plurality of openings. Next, in FIG. 4C, metal patterns 110' are formed in the openings of the dielectric material layer 402'. It is noted that, the formation of the metal patterns 110' for example comprises steps of forming a Ti/Cu seed layer, Cu plating, and removing the residual dielectric material, Cu and Ti, and the present disclosure is not limited thereto.

Figure 4D:
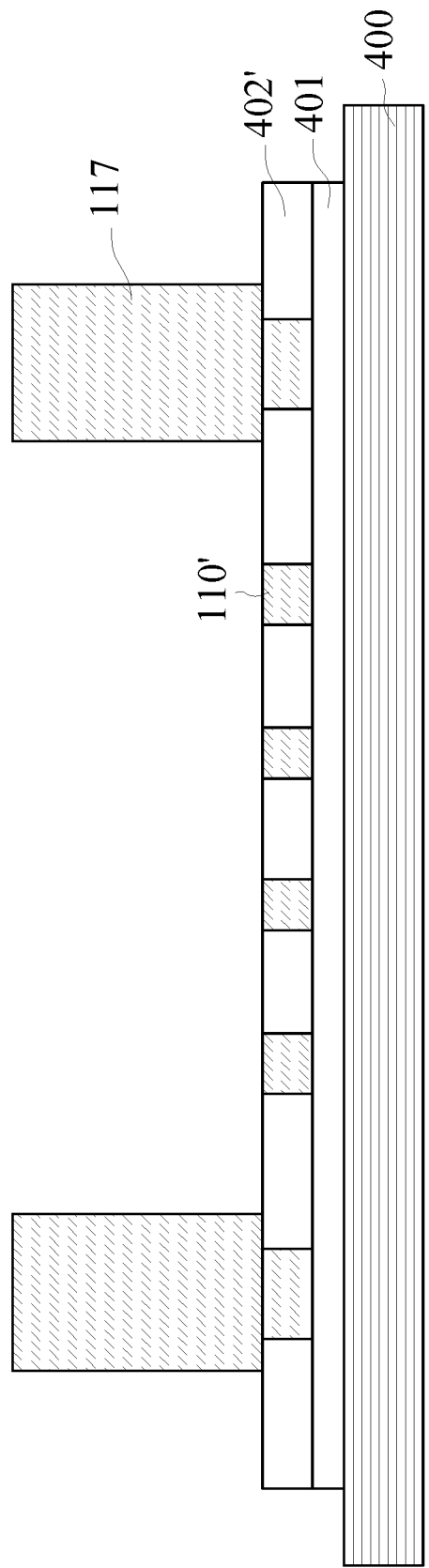
FIG. 4D is a product section view of a step of a method for manufacturing a multi-band antenna package structure according to one embodiment of the present disclosure.

Then, a seed layer (such as, Ti/Cu seed layer) is formed on the dielectric material layer 402' and the metal patterns 110', and then a thick dielectric material layer with defined openings are formed on the seed layer. Next, in FIG. 4D, metal vias 117 are formed on the dielectric material layer 402' and the metal patterns 110' while the seed layer is removed. It is noted that, the formation of the metal vias 117 for example comprises steps of Cu plating and removing the residual dielectric material, Cu and Ti, and the present disclosure is not limited thereto.

Figure 4E:
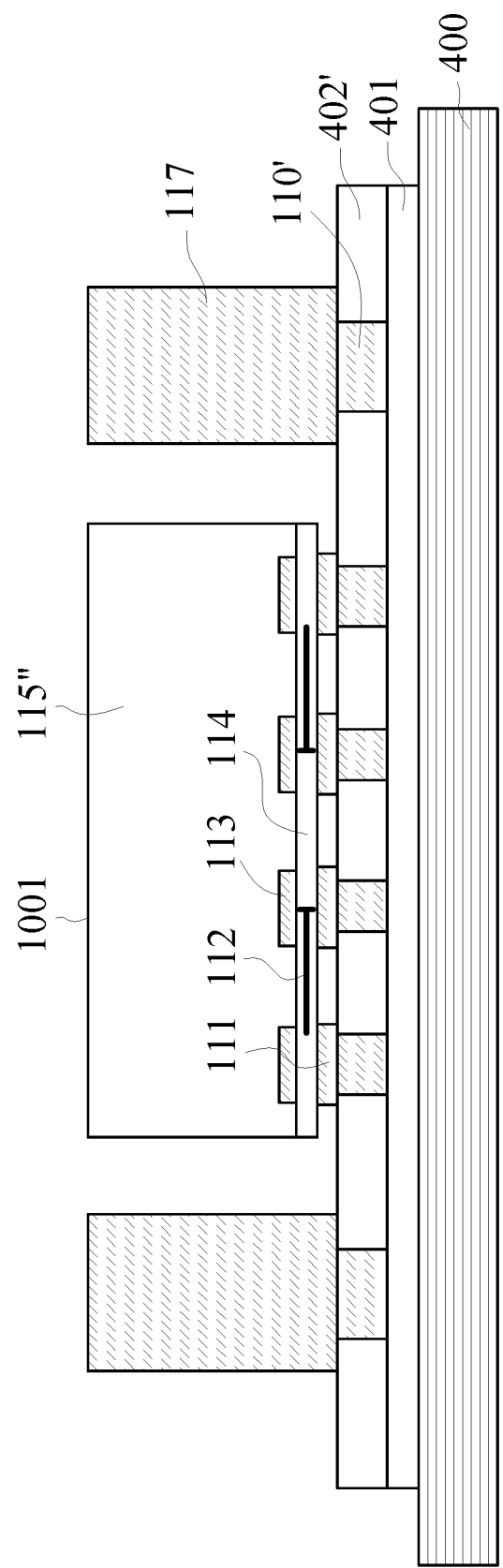
FIG. 4E is a product section view of a step of a method for manufacturing a multi-band antenna package structure according to one embodiment of the present disclosure.

Next, in FIG. 4E, metal pillars 111 are formed on the metal patterns 110' between the metal vias 117, and then an integrated circuit chip 1001 (such as a radio frequency integrated circuit chip) with the antenna unit 112 disposed on the integrated circuit 114 is attached on the metal patterns 110' between the metal vias 117 through the metal pillars 111, wherein the molding material 115" covers the integrated circuit 114 and the electrode pads 113. Thus, the electrode pads 113 of the integrated circuit chip 100 are electrically connected to the portions of the metal patterns 110' through the metal pillars 111.

In the embodiment the height of the integrated circuit chip 1001 is higher than that of the metal vias 117, and the present disclosure is not thereto. In other one embodiment, the height of the integrated circuit chip 1001 is lower than that of the metal vias 117. In addition, the antenna unit 112 in fact is the on-chip antenna, which helps the compactness and miniaturization of the multi-band antenna package structure.

Figure 4F:
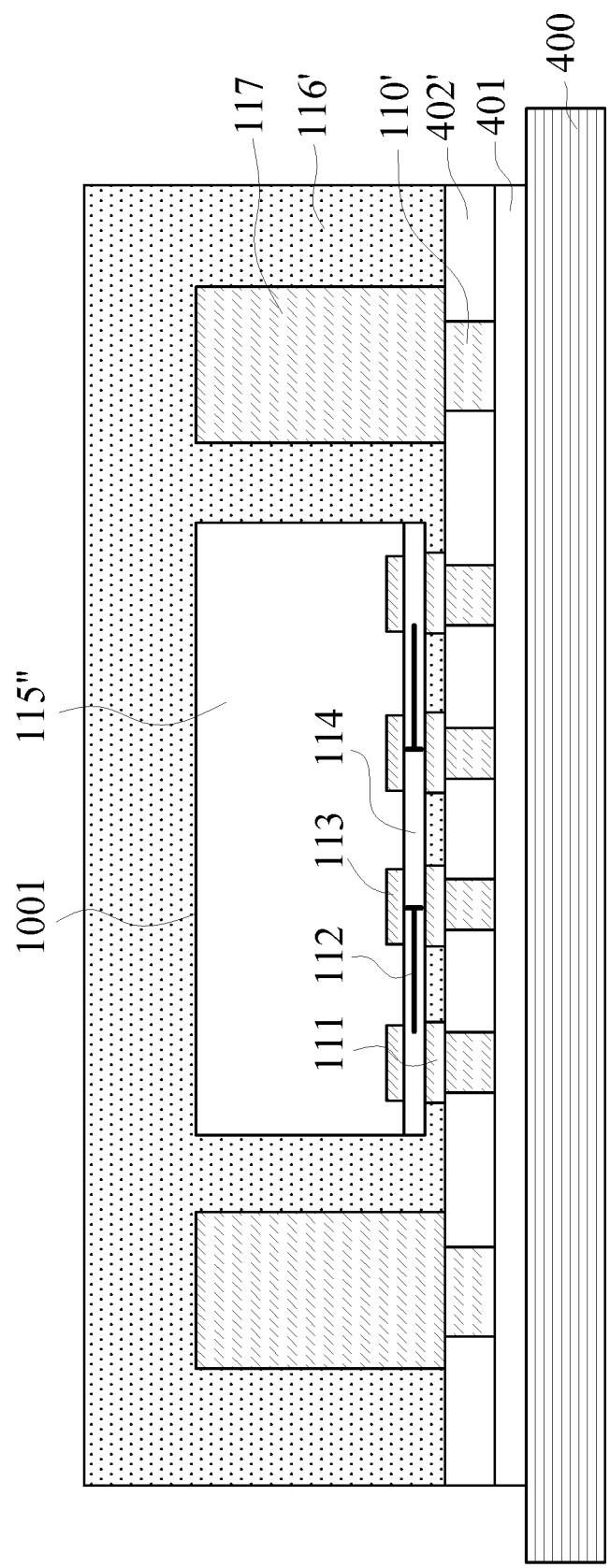
FIG. 4F is a product section view of a step of a method for manufacturing a multi-band antenna package structure according to one embodiment of the present disclosure.
Figure 4G:
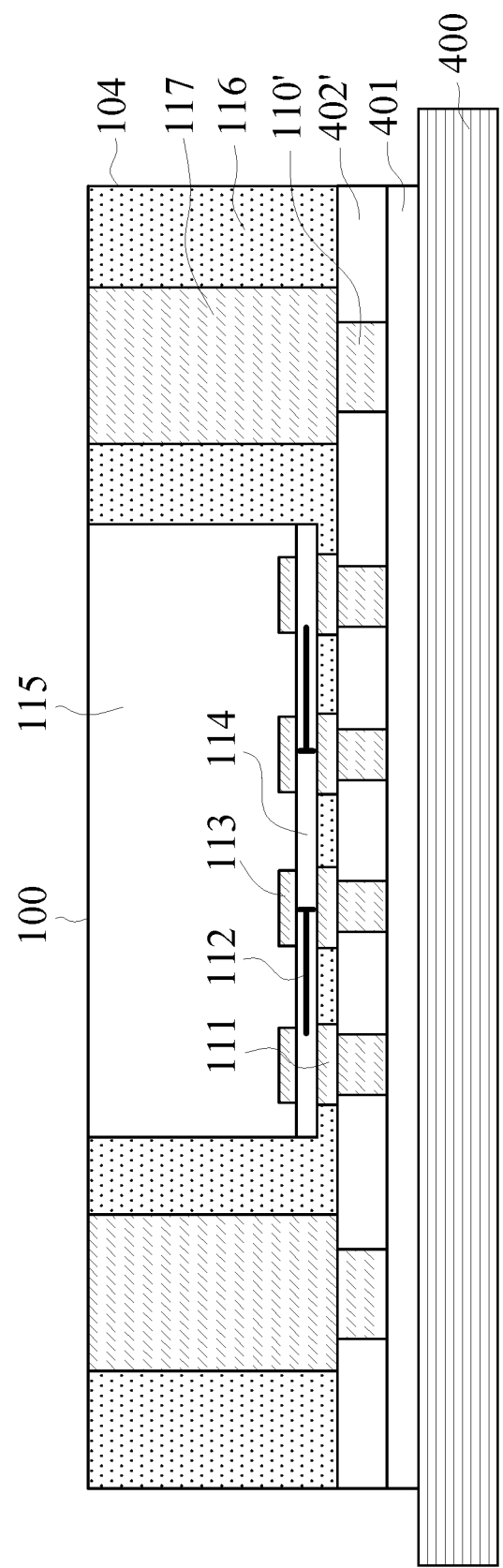
FIG. 4G is a product section view of a step of a method for manufacturing a multi-band antenna package structure according to one embodiment of the present disclosure.

Next, in FIG. 4F, a molding layer 116', for example, made of molding compound or molded underfill (MUF) is formed to cover the metal pillars 111, the integrated circuit chip 1001 and the metal vias 117. In FIG. 4G, the molding layer 116' is thinned down (such as use grind or chemical mechanical polishing (CMP) process) to expose the metal vias 117. Portions of the semiconductor material 115' are also thinned down to expose the semiconductor material 115, and the integrated circuit layer 104 having the integrated circuit integrated circuit chip 100 therein is thus formed. In other one embodiment, the portions of the semiconductor material 115" may not be thinned down.

Figure 4H:
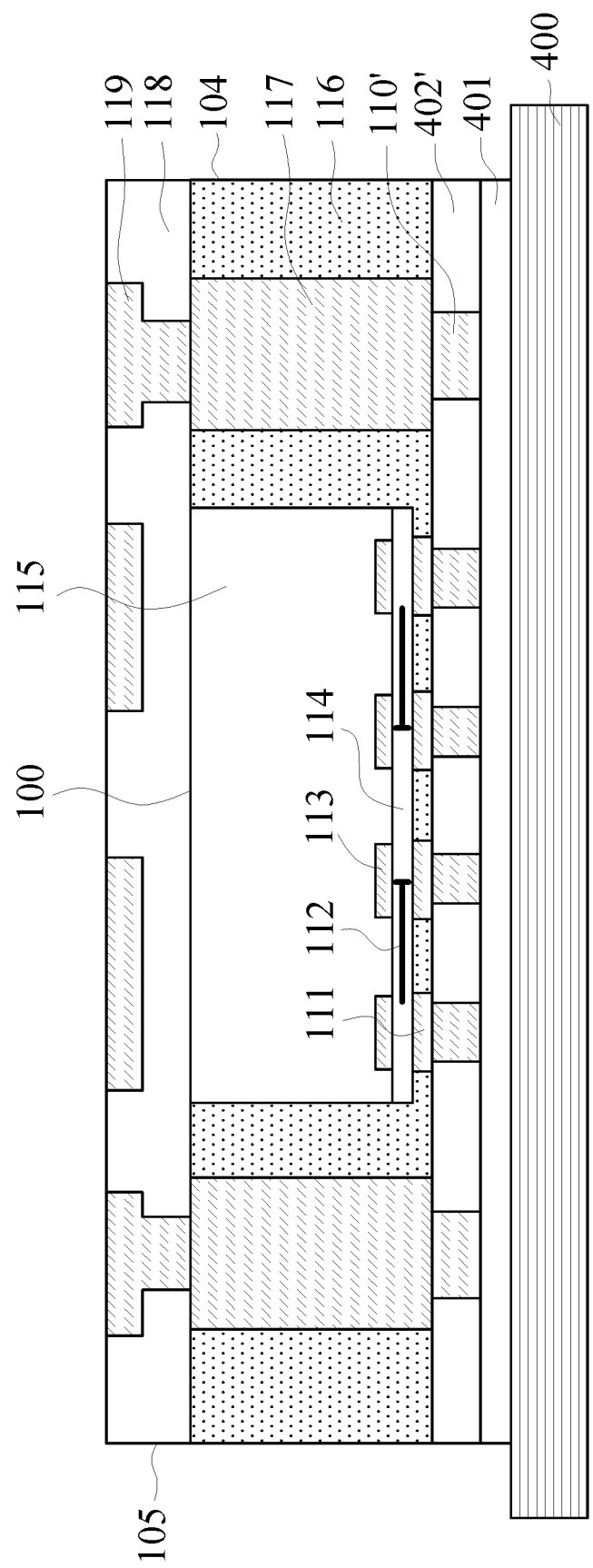
FIG. 4H is a product section view of a step of a method for manufacturing a multi-band antenna package structure according to one embodiment of the present disclosure.

Next, in FIG. 4H, a redistribution layer 105 is formed on the integrated circuit layer 104. It is noted that, a dielectric material layer 118 is formed on the integrated circuit layer 104, and then, multiple openings are formed in the dielectric material layer 118. Then, the metal patterns 119 are in the openings of the dielectric material layer 118, wherein portions of the metal patterns 119 are electrically connected to the metal vias 117.

Figure 4I:
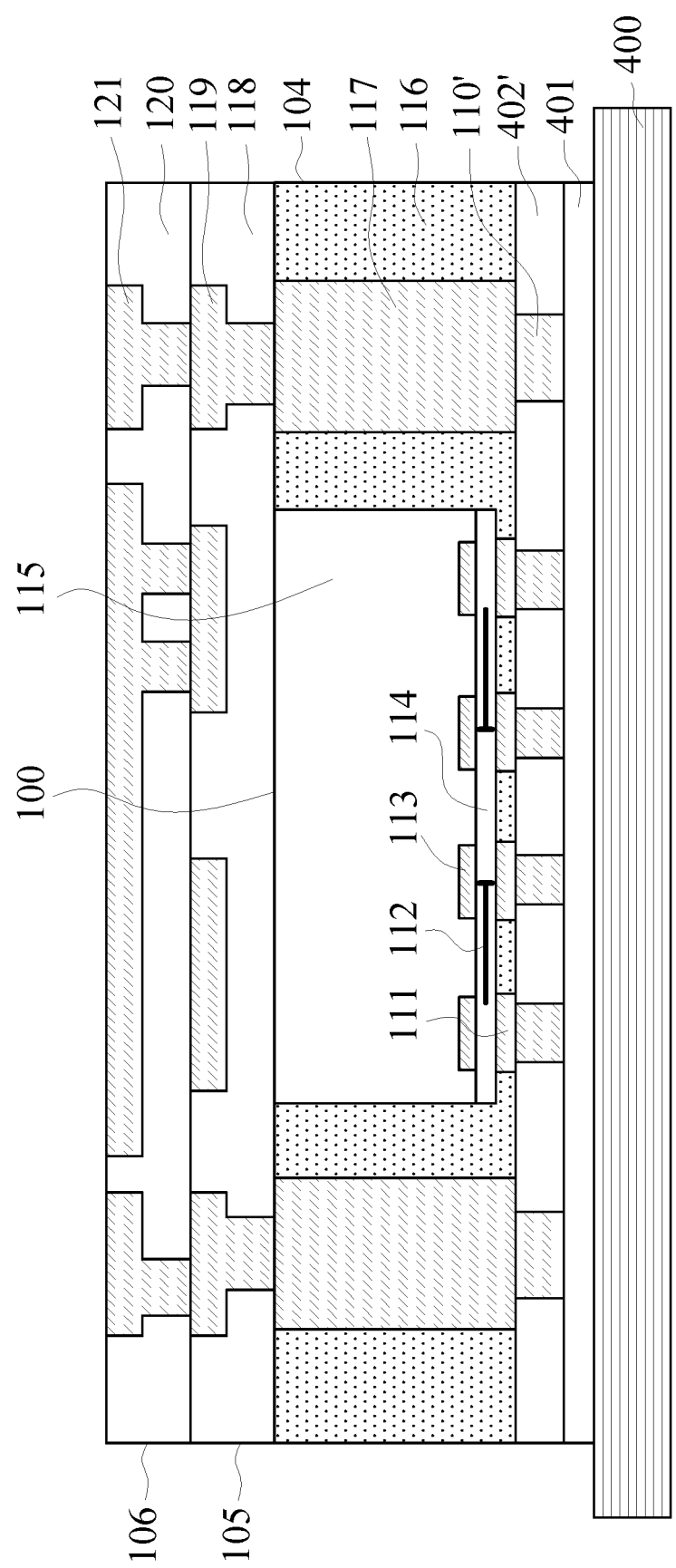
FIG. 4I is a product section view of a step of a method for manufacturing a multi-band antenna package structure according to one embodiment of the present disclosure.

Next, in FIG. 4I, a shielding layer 106 is formed on the redistribution layer 105. It is noted that, a dielectric layer 120 is formed on the redistribution layer 105, and then, multiple openings are formed in the dielectric layer 120. Then, the metal patterns 121 are in the openings of the dielectric layer 120, wherein the metal patterns 121 are electrically connected to the portions of the metal patterns 119.

Figure 4J:
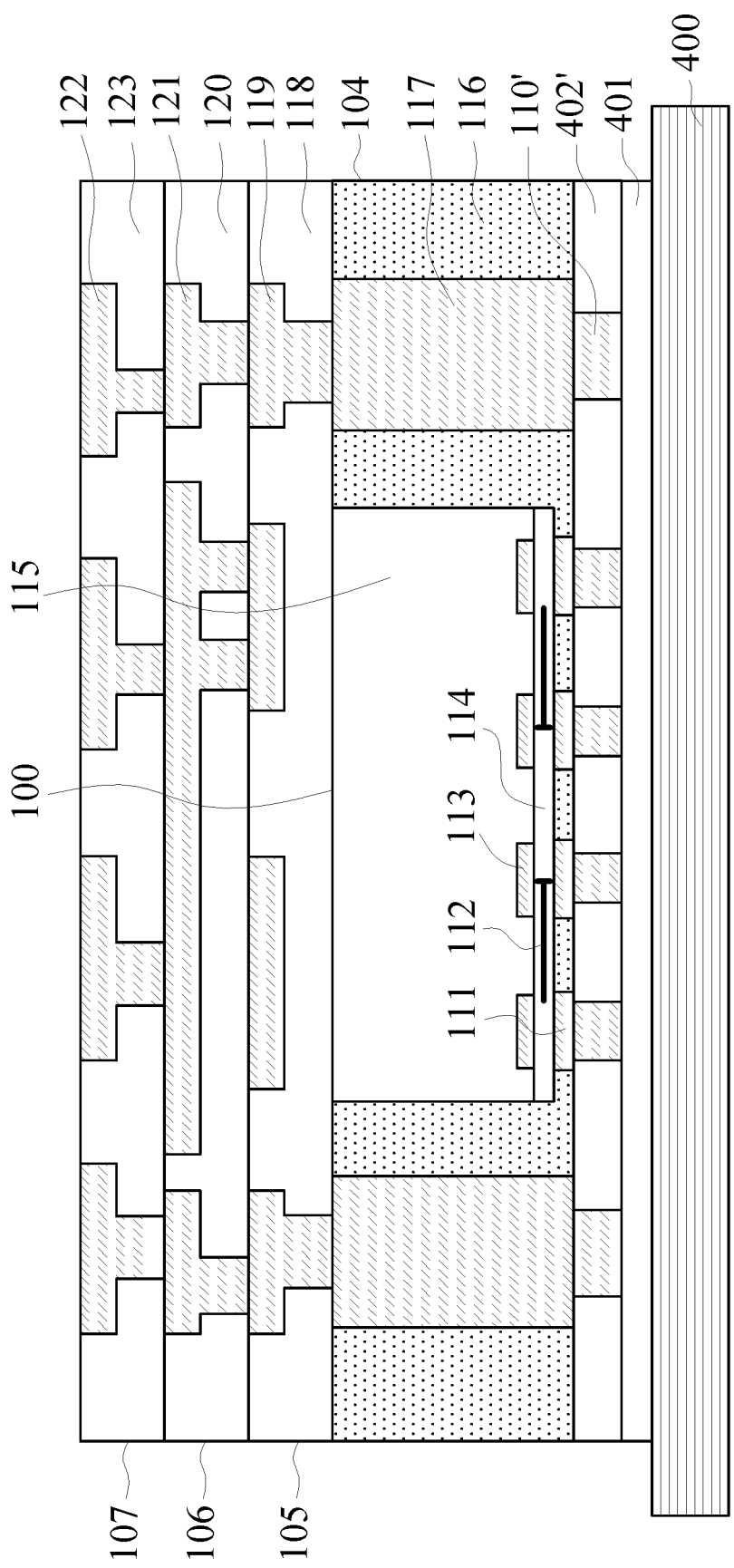
FIG. 4J is a product section view of a step of a method for manufacturing a multi-band antenna package structure according to one embodiment of the present disclosure.

Next, in FIG. 4J, an antenna unit layer 107 is formed on the shielding layer 106. It is noted that, a dielectric layer 123 is formed on the shielding layer 106, and then, multiple openings are formed in the dielectric layer 123. Then, the metal patterns 122 are in the openings of the dielectric layer 123, wherein the metal patterns 122 are electrically connected to the metal patterns 121. The metal patterns 122 can be antennae to form a planar antenna array which can be controlled to have a specific radiation field and perform the multiple input multiple output (MIMO) transmission.

Figure 4K:
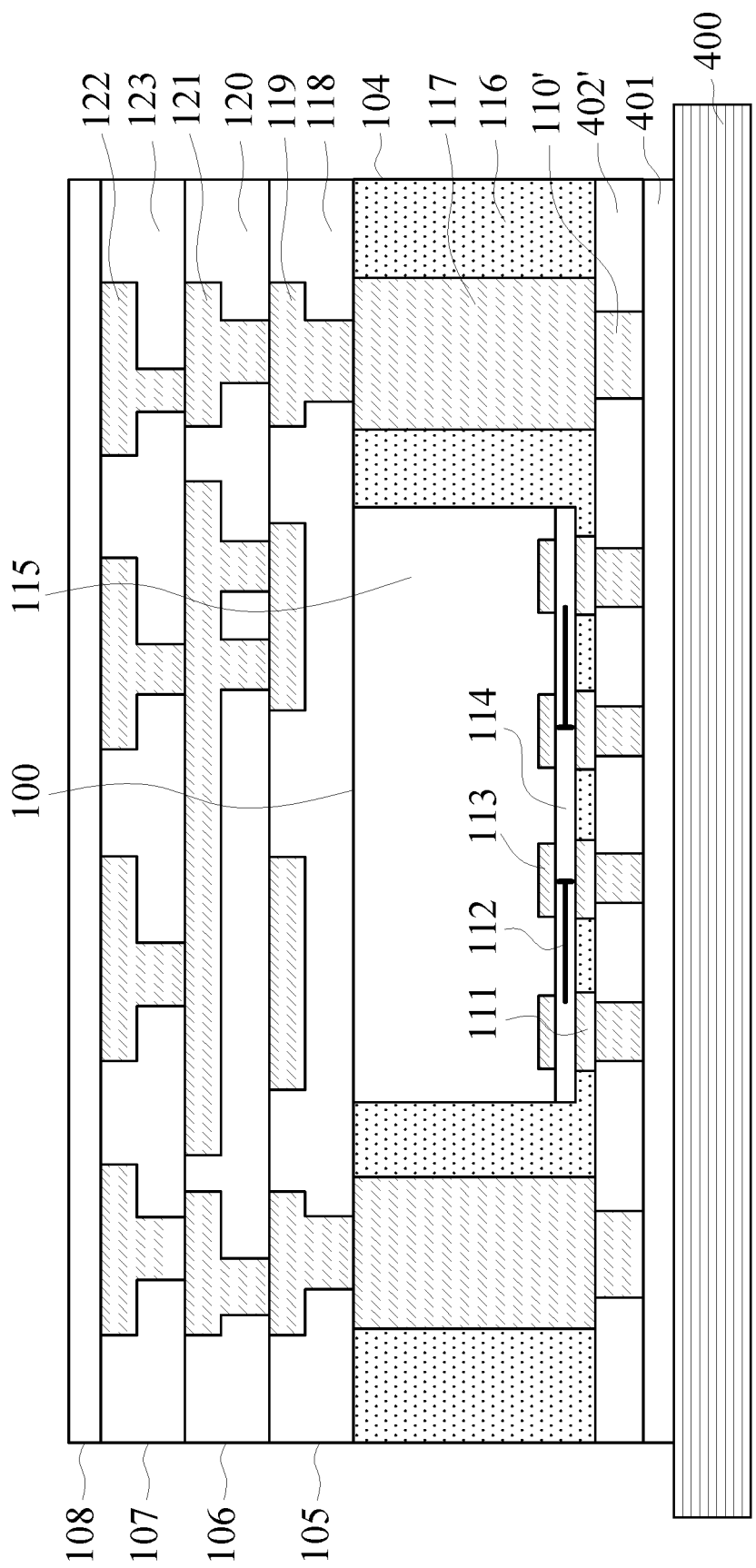
FIG. 4K is a product section view of a step of a method for manufacturing a multi-band antenna package structure according to one embodiment of the present disclosure.
Figure 4L:
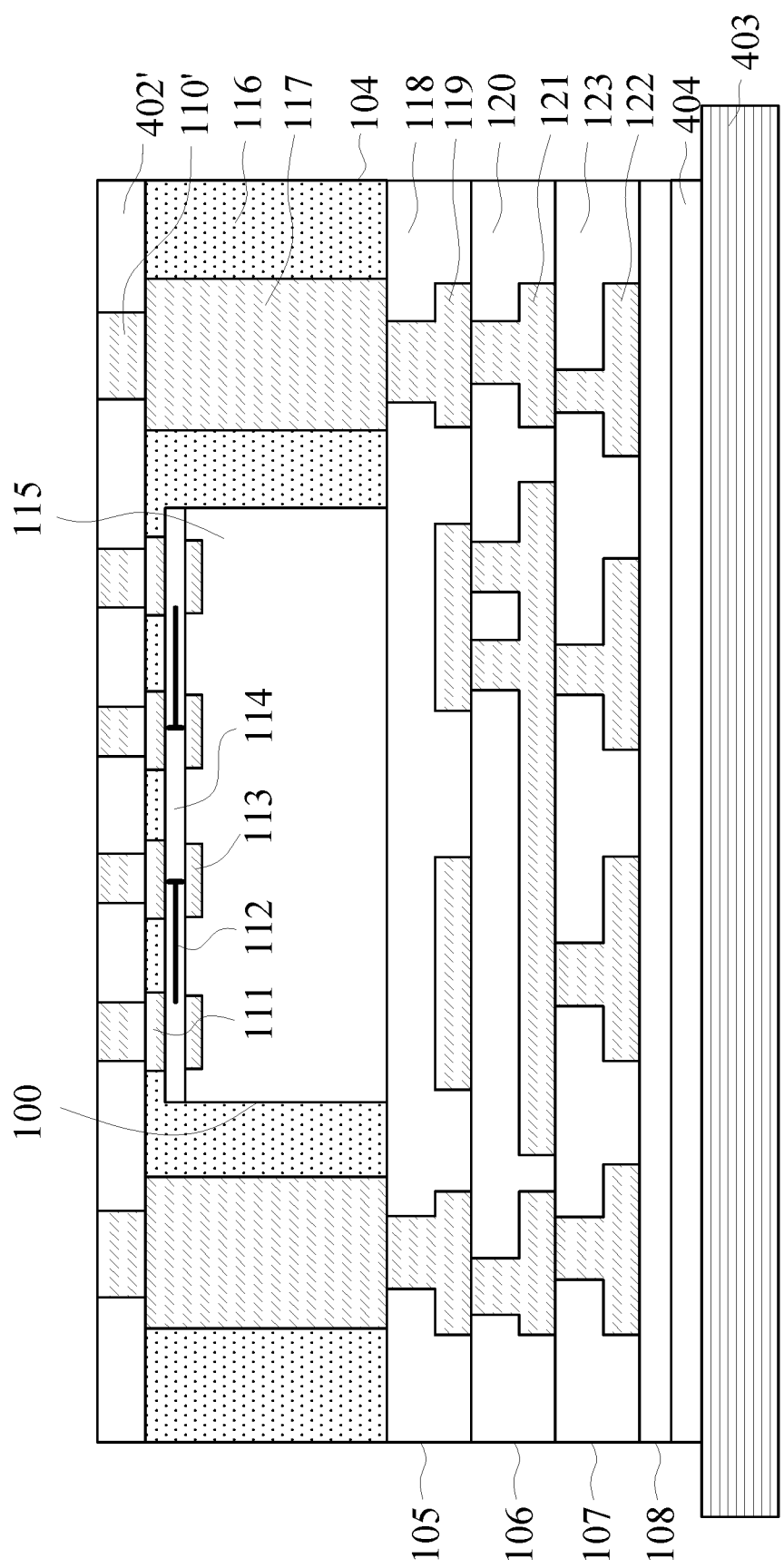
FIG. 4L is a product section view of a step of a method for manufacturing a multi-band antenna package structure according to one embodiment of the present disclosure.

Next, in FIG. 4K, a protection layer 108 is formed on the antenna unit layer 107, such that a first stacked structure is formed. Then, in FIG. 4L, the temporary substrate 400 with the glue layer 401 are removed, and the first stacked structure is faced down to be adhered by a temporary substrate 403 by a glue layer 404, wherein the protection layer 108 is disposed on the glue layer 404.

Figure 4M:
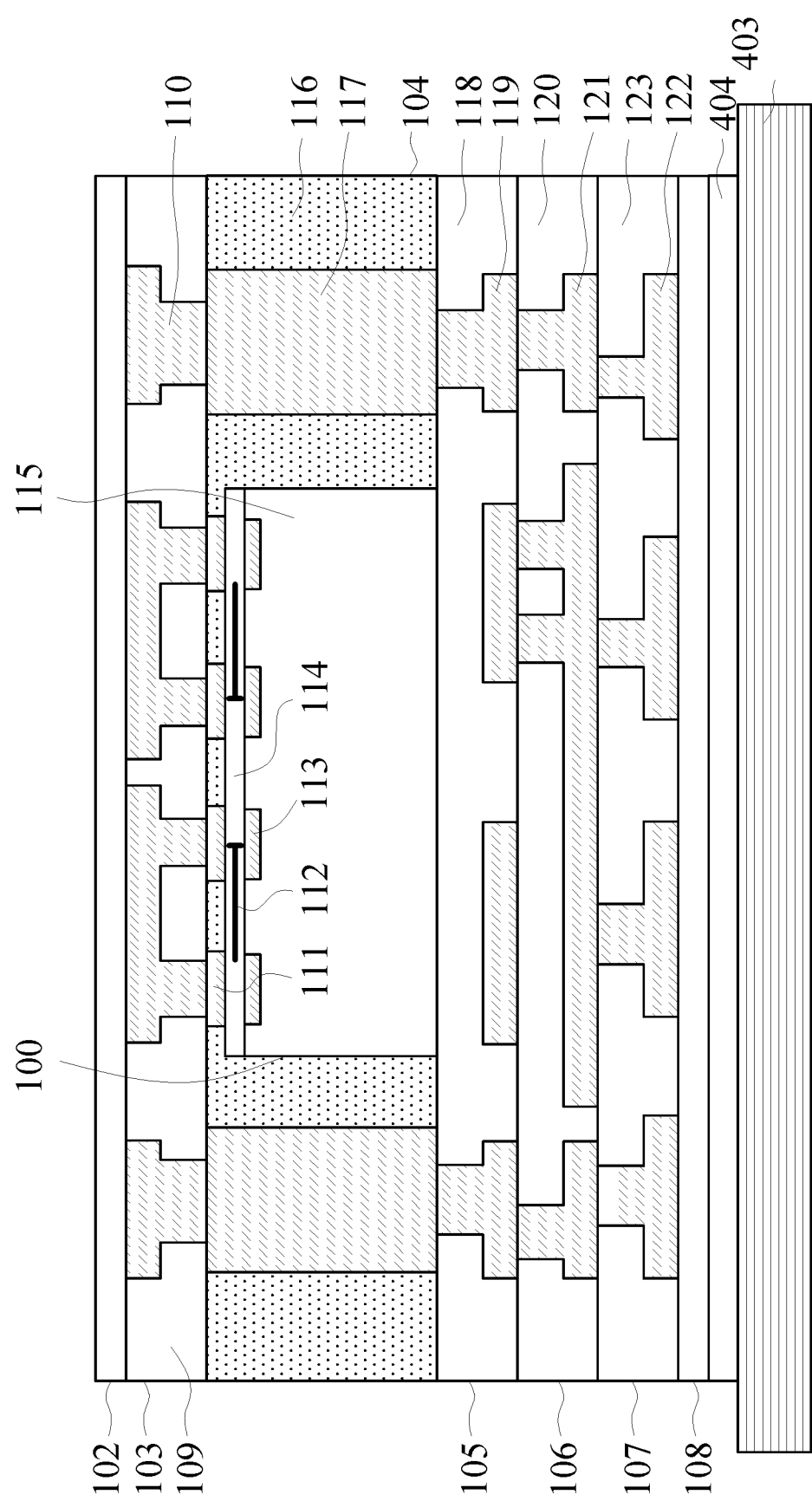
FIG. 4M is a product section view of a step of a method for manufacturing a multi-band antenna package structure according to one embodiment of the present disclosure.

Next, in FIG. 4M, a redistribution layer 103 is formed on the integrated circuit layer 104, and then a passivation layer 102 is formed on the redistribution layer 103, wherein the portions of the metal patterns 110 are electrically connected to the metal vias 117. It is noted that the dielectric material layer 109 is firstly formed to replace the original dielectric material layer 402', then multiple openings of the dielectric material layer 109 are formed, and next the metal patterns 110 are formed in the openings of the dielectric material layer 109 to replace the metal patterns 110', such that the redistribution layer 103 can formed.

Figure 4N:
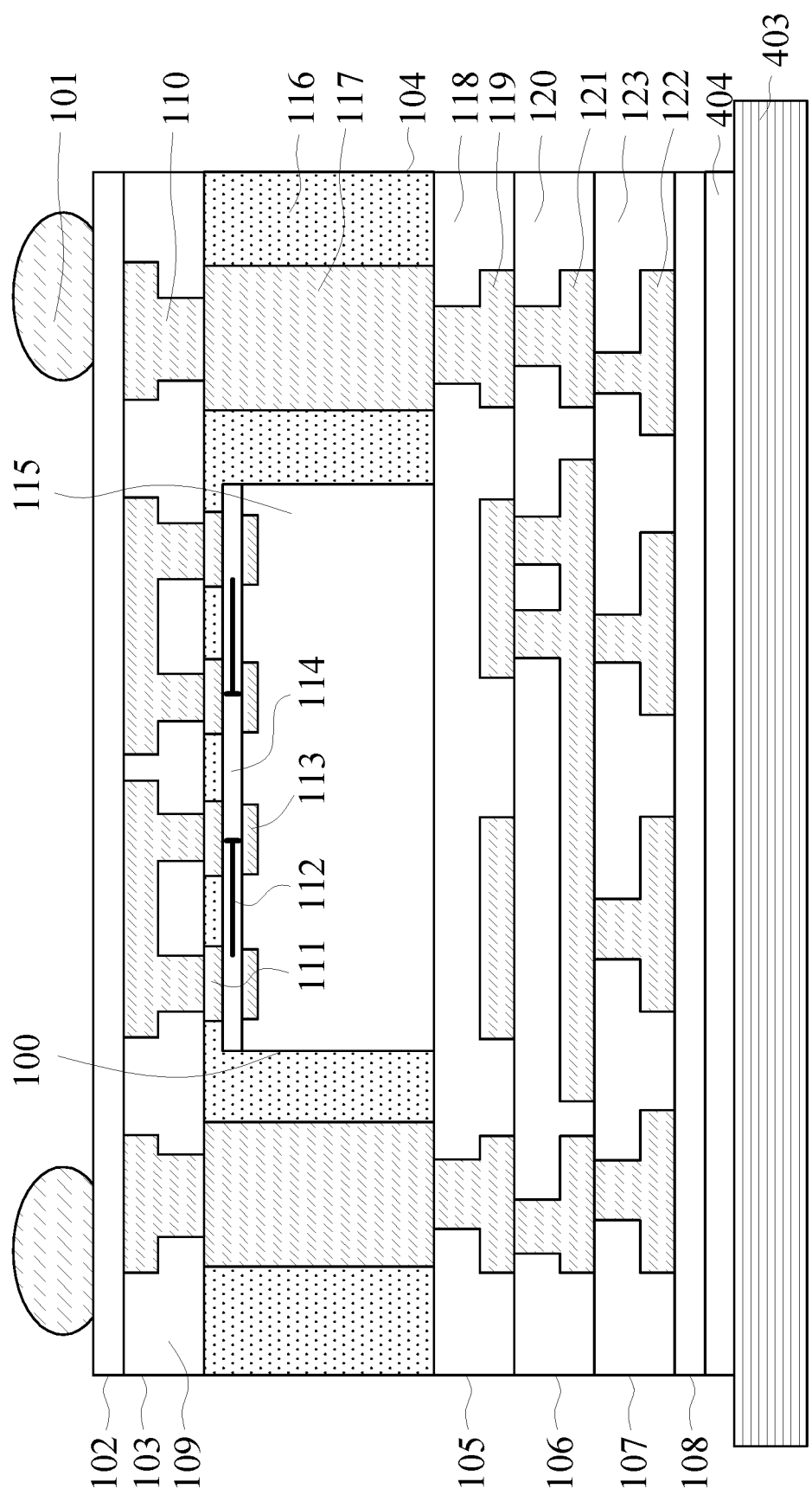
FIG. 4N is a product section view of a step of a method for manufacturing a multi-band antenna package structure according to one embodiment of the present disclosure.
Figure 4O:
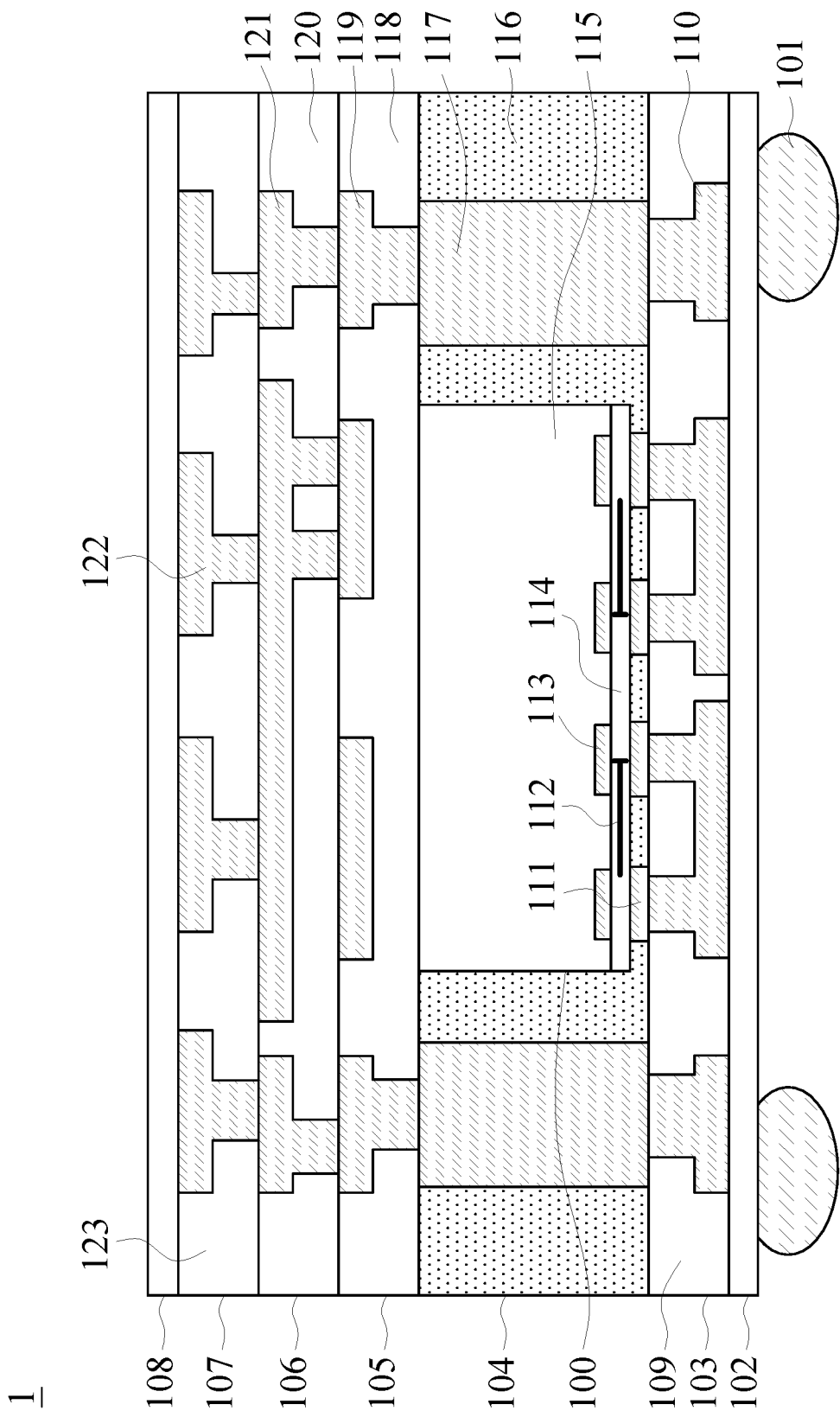
FIG. 4O is a product section view of a step of a method for manufacturing a multi-band antenna package structure according to one embodiment of the present disclosure.

Next, in FIG. 4N, bump balls 101 are formed on the passivation layer 102, so as to form a second stacked structure. Next, the glue layer 404 and the temporary substrate 403 are removed, and the second stacked structure is faced down as shown in FIG. 4O. Referring to FIG. 4O, the multi-band antenna package 1 is formed, that can be mounted on a substrate through the bump balls 101.

It is noted that, the method for manufacturing the multi-band antenna package structure 2 in FIG. 2 can be deduced by the embodiment of FIG. 4A through FIG. 4 while the height of the integrated circuit chip 1001 is lower than the height of the metal vias 117 and the chip mold material 115' is not thinned down.

Figure 5A:
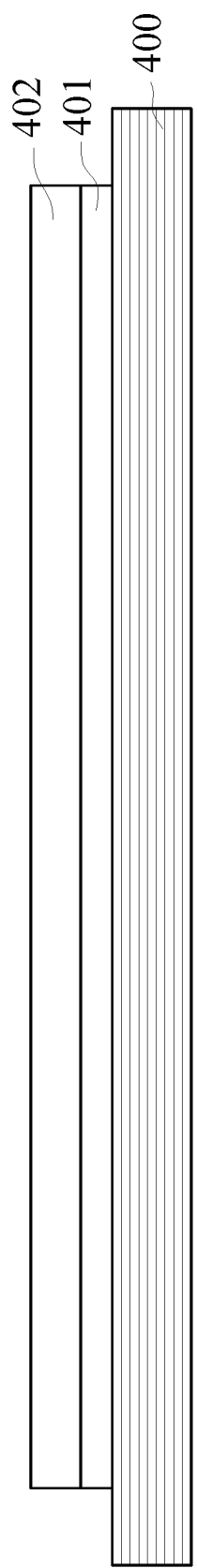
FIG. 5A is a product section view of a step of a method for manufacturing a multi-band antenna package structure according to another one embodiment of the present disclosure.
Figure 5B:
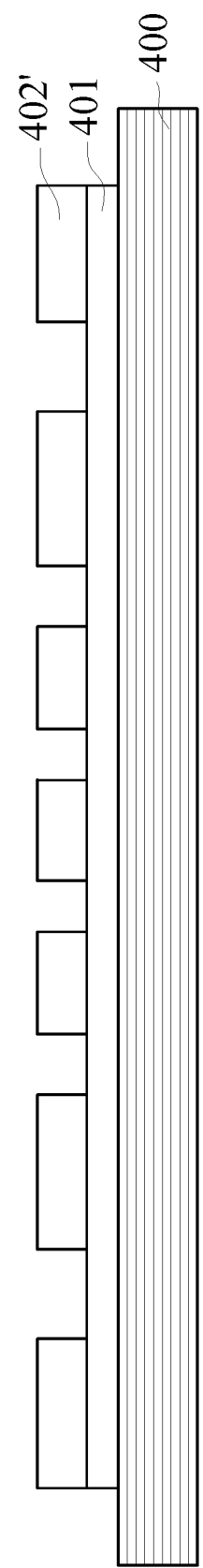
FIG. 5B is a product section view of a step of a method for manufacturing a multi-band antenna package structure according to another one embodiment of the present disclosure.
Figure 5C:
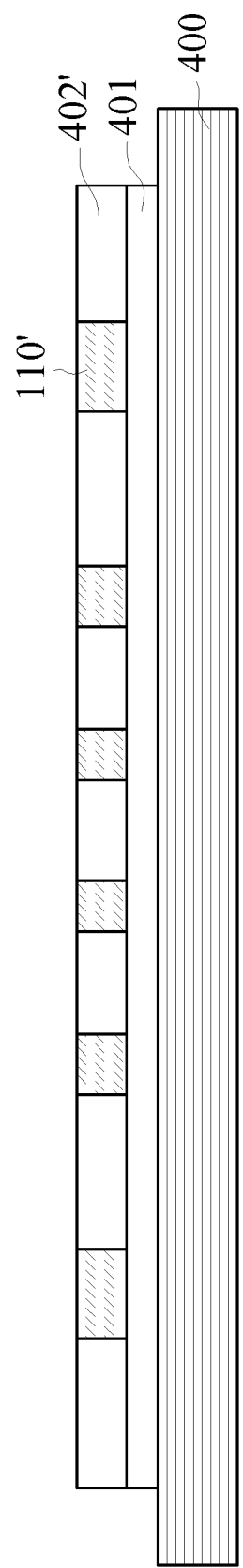
FIG. 5C is a product section view of a step of a method for manufacturing a multi-band antenna package structure according to another one embodiment of the present disclosure.
Figure 5D:
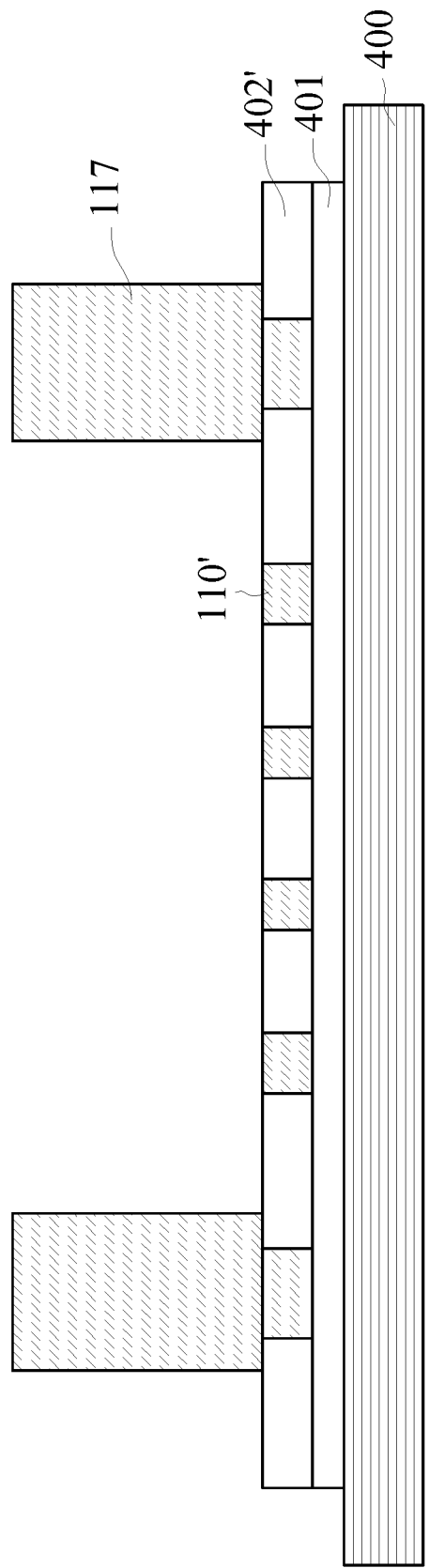
FIG. 5D is a product section view of a step of a method for manufacturing a multi-band antenna package structure according to another one embodiment of the present disclosure.

Furthermore, a method for manufacturing the multi-band antenna package structures 3 of FIG. 3 is illustrated as follows. FIG. 5A through FIG. 5O are product section views of steps of a method for manufacturing a multi-band antenna package structure according to another one embodiment of the present disclosure. It is noted that the details of FIG. 5A through FIG. 5D are the same as those of FIG. 4A through FIG. 4D, and thus the redundant descriptions are omitted.

Figure 5E:
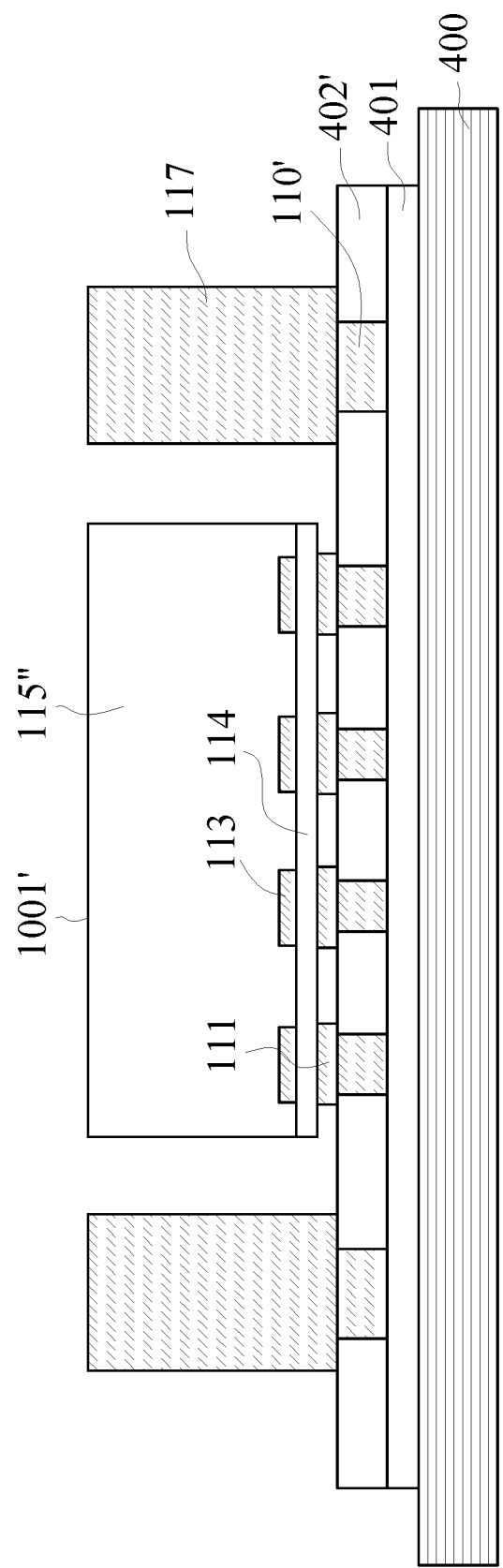
FIG. 5E is a product section view of a step of a method for manufacturing a multi-band antenna package structure according to another one embodiment of the present disclosure.
Figure 5F:
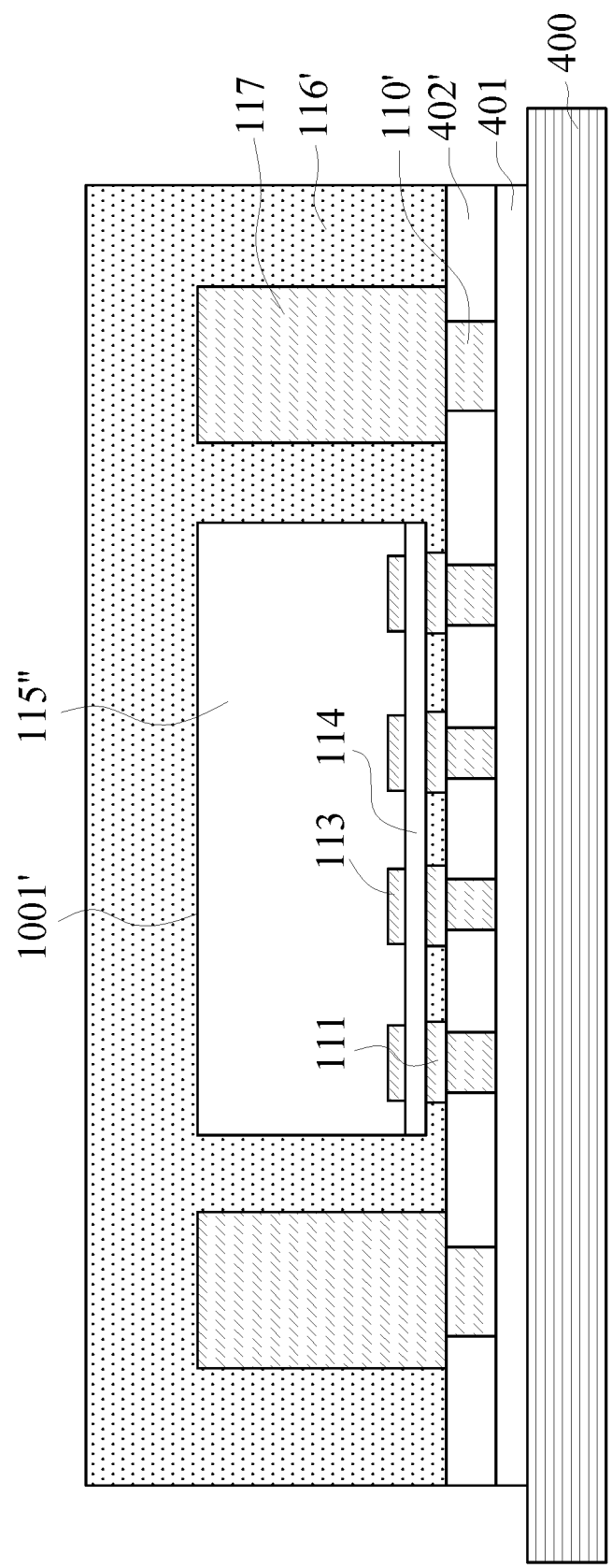
FIG. 5F is a product section view of a step of a method for manufacturing a multi-band antenna package structure according to another one embodiment of the present disclosure.
Figure 5G:
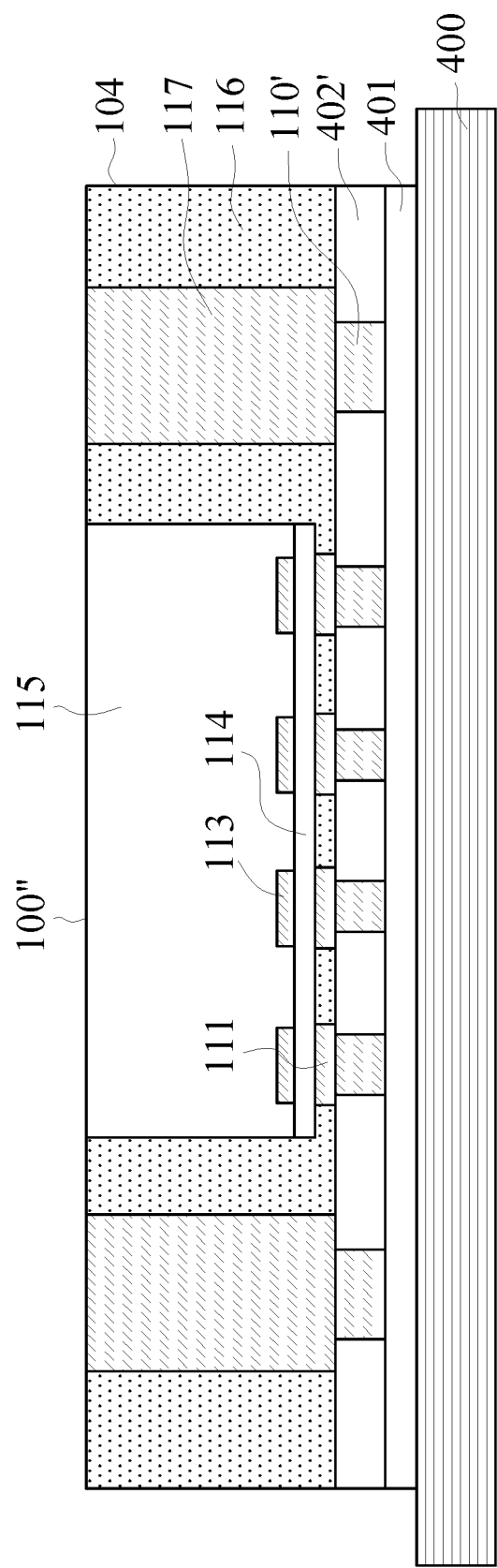
FIG. 5G is a product section view of a step of a method for manufacturing a multi-band antenna package structure according to another one embodiment of the present disclosure.
Figure 5H:
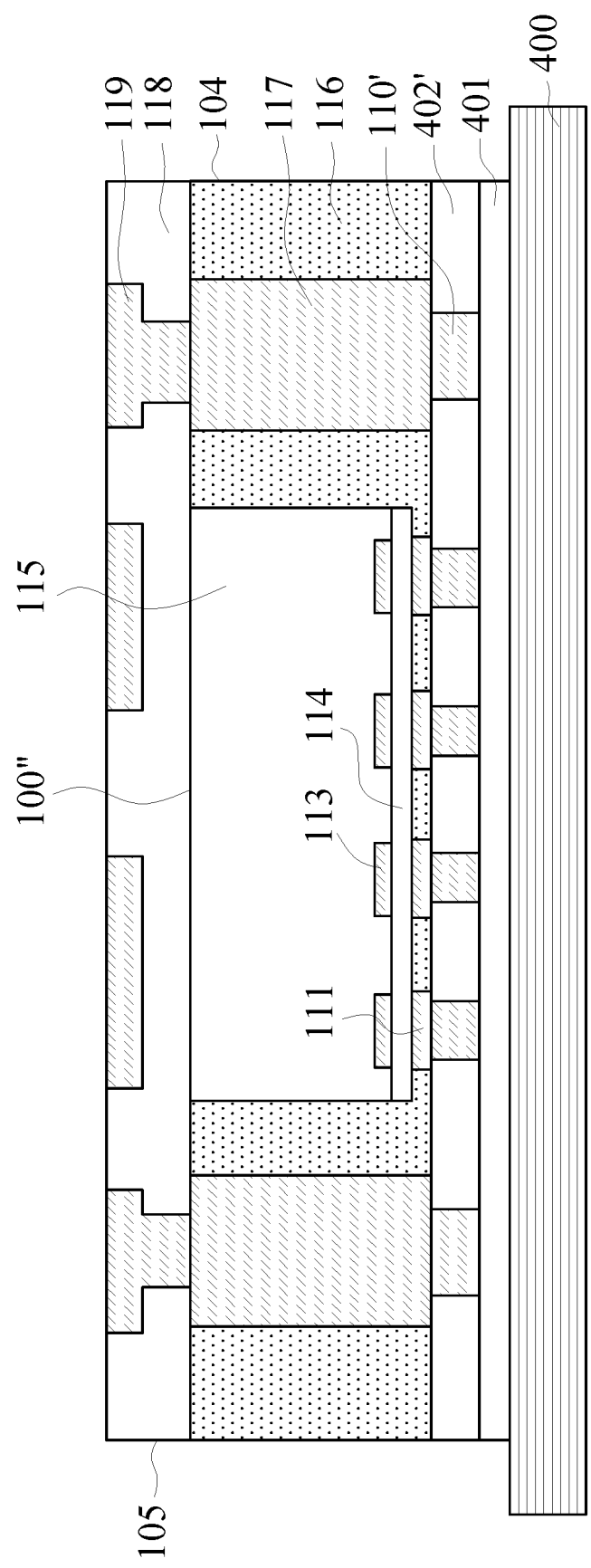
FIG. 5H is a product section view of a step of a method for manufacturing a multi-band antenna package structure according to another one embodiment of the present disclosure.
Figure 5I:
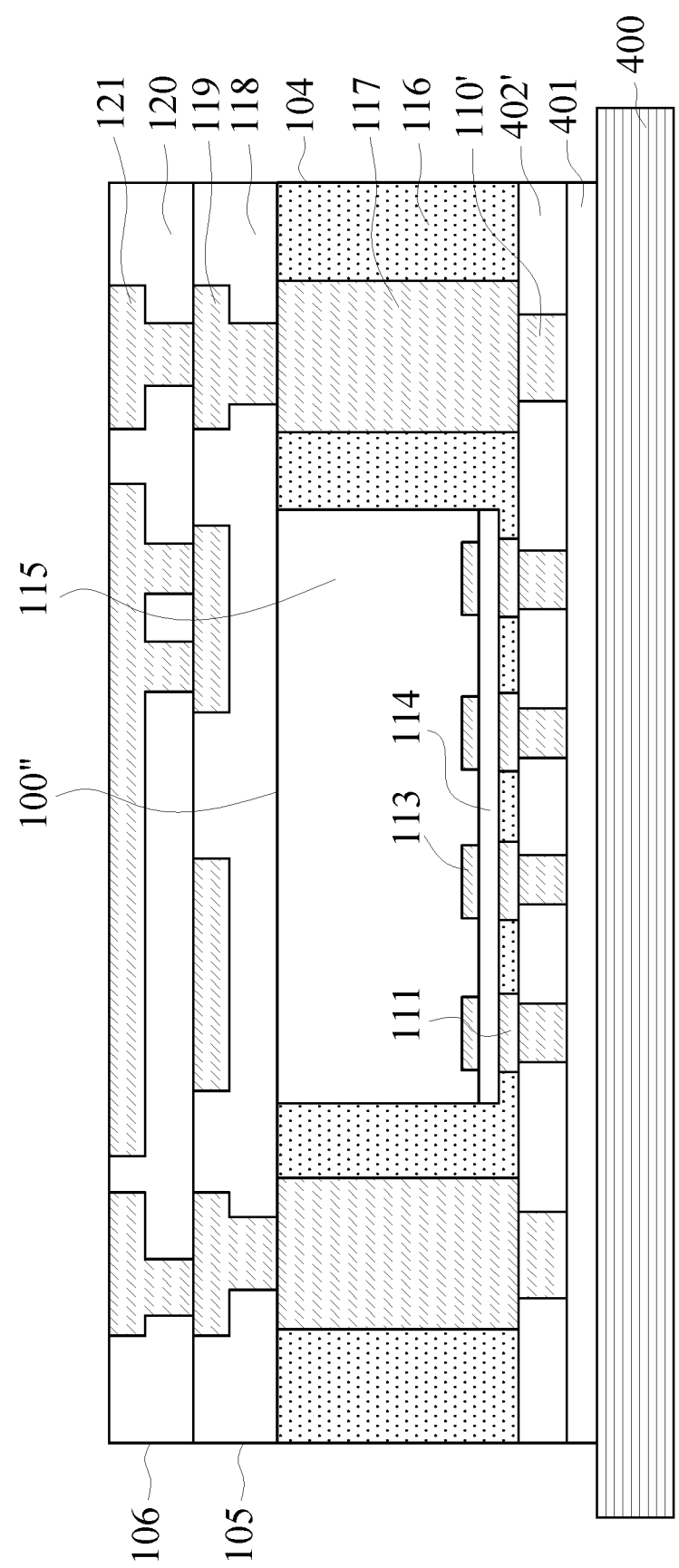
FIG. 5I is a product section view of a step of a method for manufacturing a multi-band antenna package structure according to another one embodiment of the present disclosure.
Figure 5J:
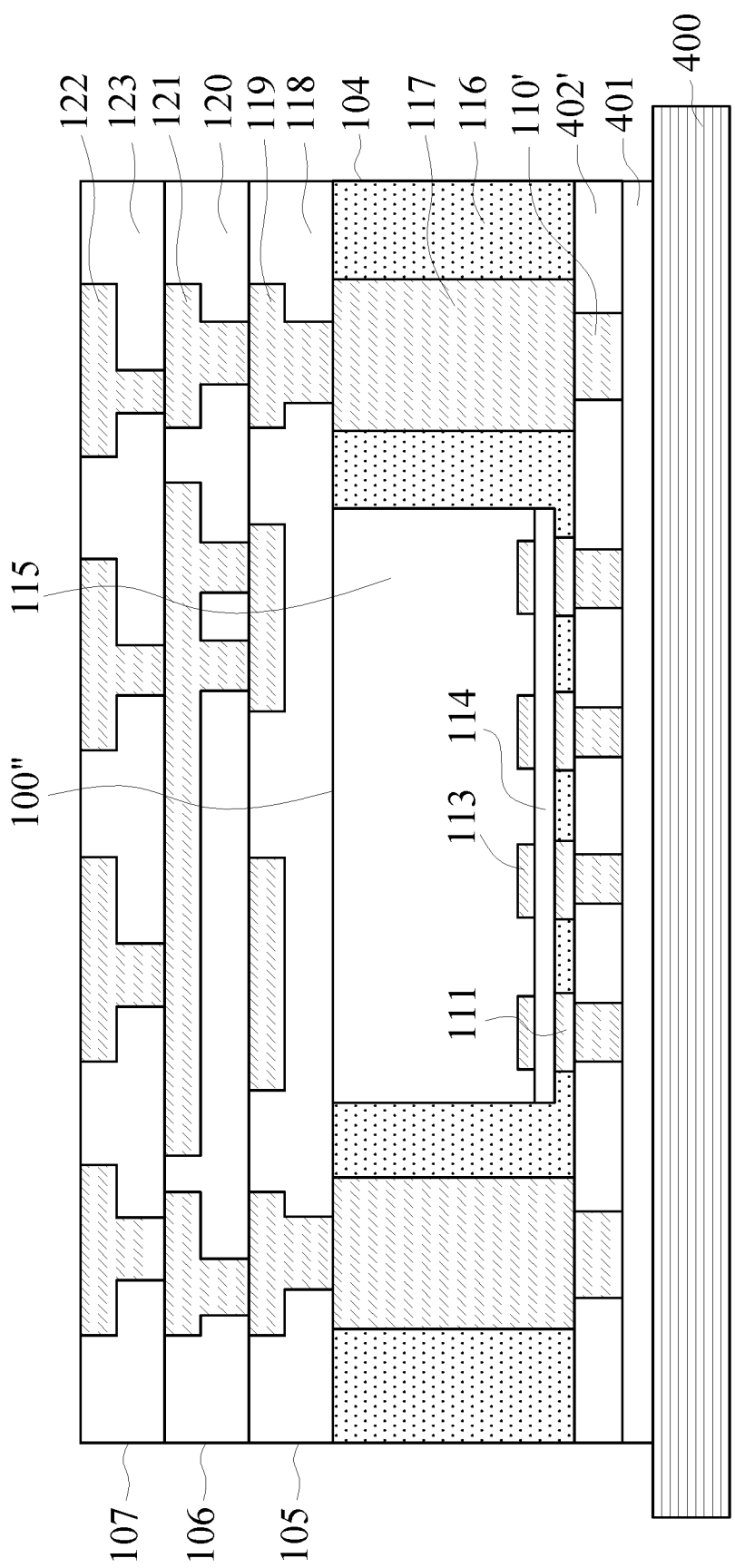
FIG. 5J is a product section view of a step of a method for manufacturing a multi-band antenna package structure according to another one embodiment of the present disclosure.
Figure 5K:
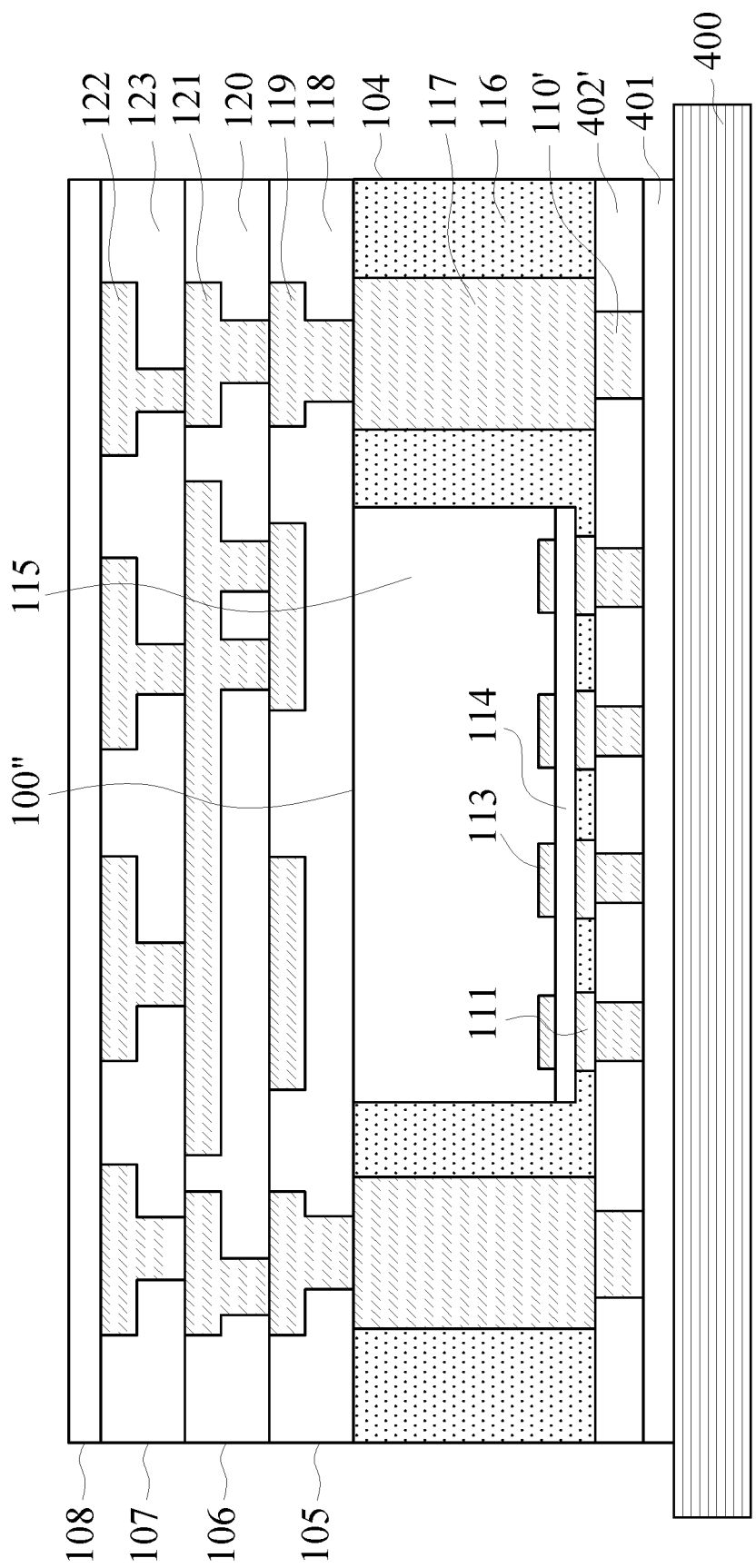
FIG. 5K is a product section view of a step of a method for manufacturing a multi-band antenna package structure according to another one embodiment of the present disclosure.
Figure 5L:
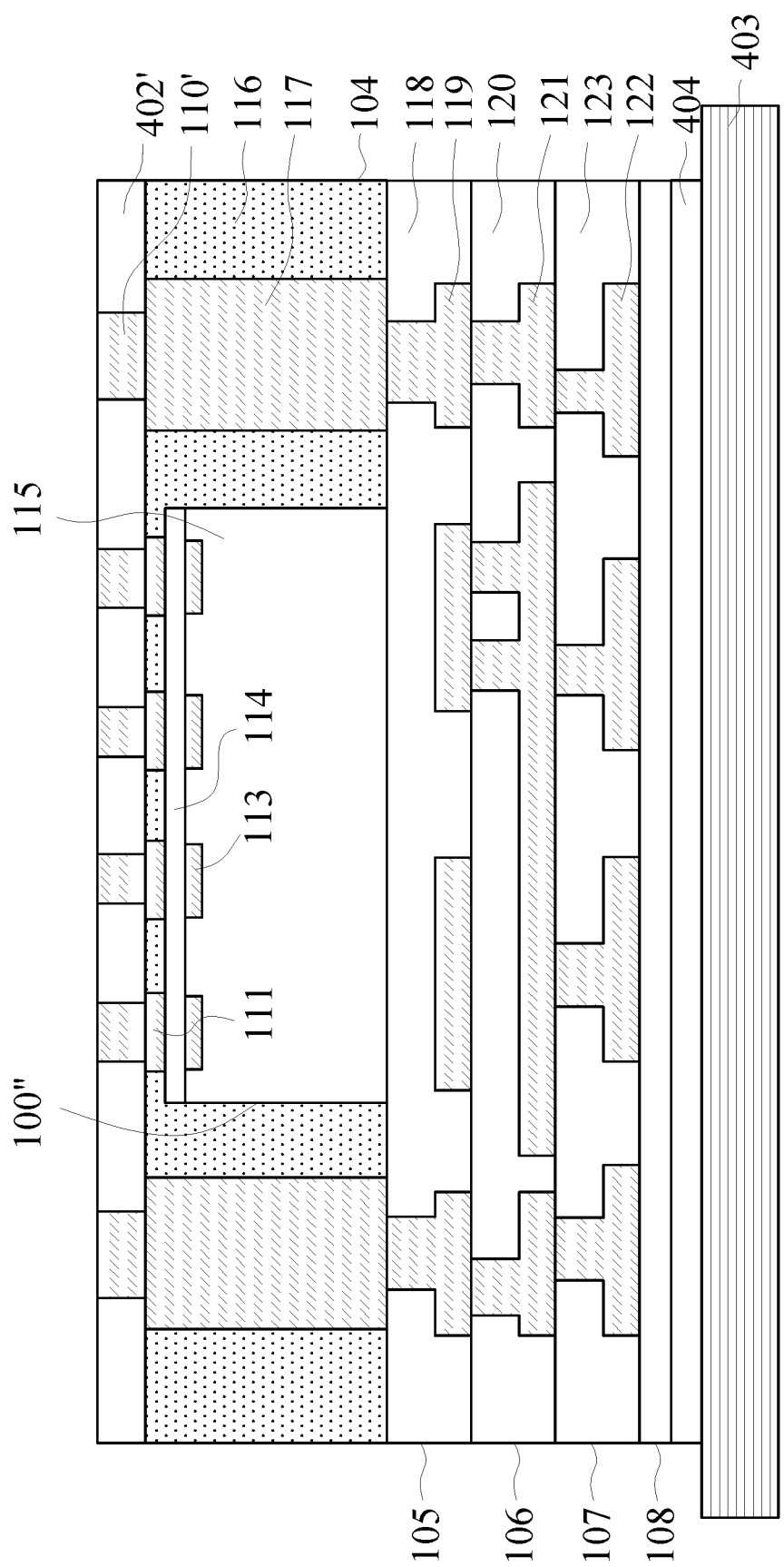
FIG. 5L is a product section view of a step of a method for manufacturing a multi-band antenna package structure according to another one embodiment of the present disclosure.

The difference between FIG. 4E and FIG. 5E is that the integrated circuit 1001' does not have the on-chip antenna (i.e. the antenna unit 112). Details of FIG. 5F through FIG. 5N are the same as those of FIG. 4F through FIG. 4N, and thus the redundant descriptions are omitted.

Figure 5M:
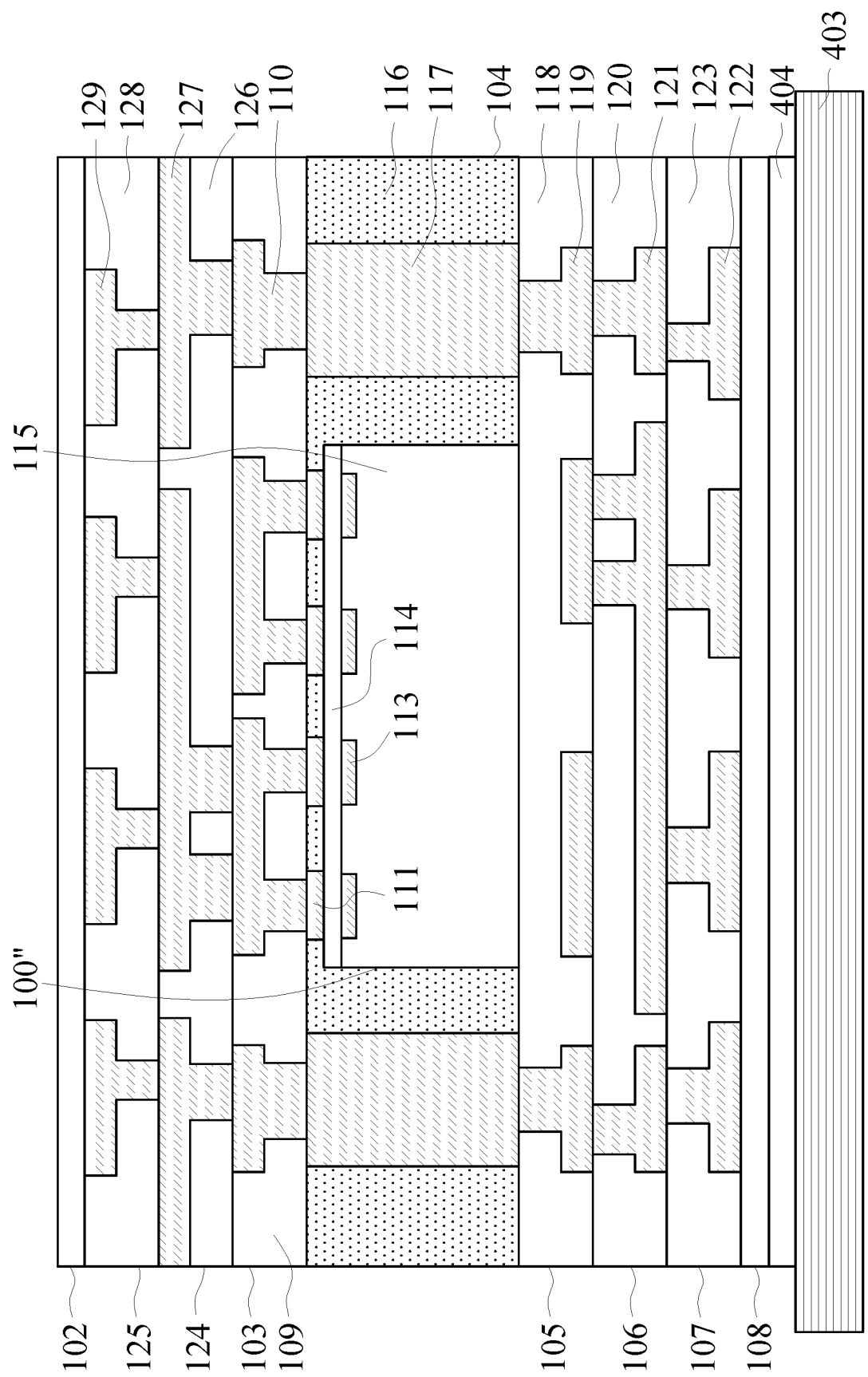
FIG. 5M is a product section view of a step of a method for manufacturing a multi-band antenna package structure according to another one embodiment of the present disclosure.

In FIG. 5M, the formation of the redistribution layer 103 is the same as that of FIG. 4M, and the thus the redundant descriptions are omitted. Next, a shielding layer 124 is formed on the redistribution layer 103. It is noted that, a dielectric layer 126 is formed on the redistribution layer 103, and then, multiple openings are formed in the dielectric layer 126. Then, the metal patterns 127 are in the openings of the dielectric layer 126, wherein the metal patterns 127 are electrically connected to the portions of the metal patterns 110.

Next, an antenna unit layer 125 is formed on the shielding layer 124. It is noted that, a dielectric layer 128 is formed on the shielding layer 124, and then, multiple openings are formed in the dielectric layer 128. Then, the metal patterns 129 are in the openings of the dielectric layer 128, wherein the metal patterns 129 are electrically connected to the metal patterns 127. The metal patterns 129 can be antennae to form another one planar antenna array which can be controlled to have a specific radiation field and perform the multiple input multiple output (MIMO) transmission. Then, a protection layer 102 is formed on the antenna unit layer 107.

Figure 5N:
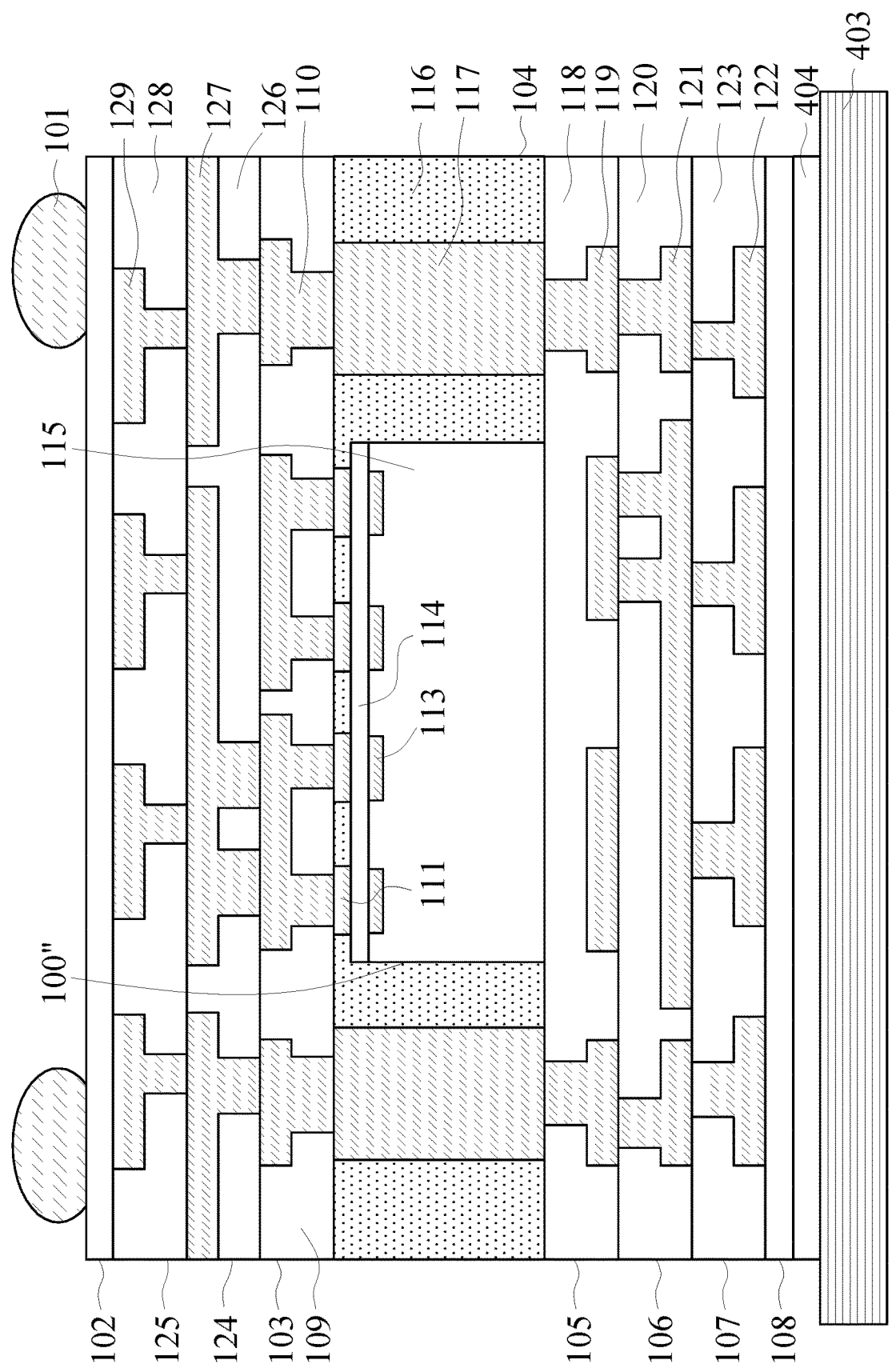
FIG. 5N is a product section view of a step of a method for manufacturing a multi-band antenna package structure according to another one embodiment of the present disclosure.
Figure 5O:
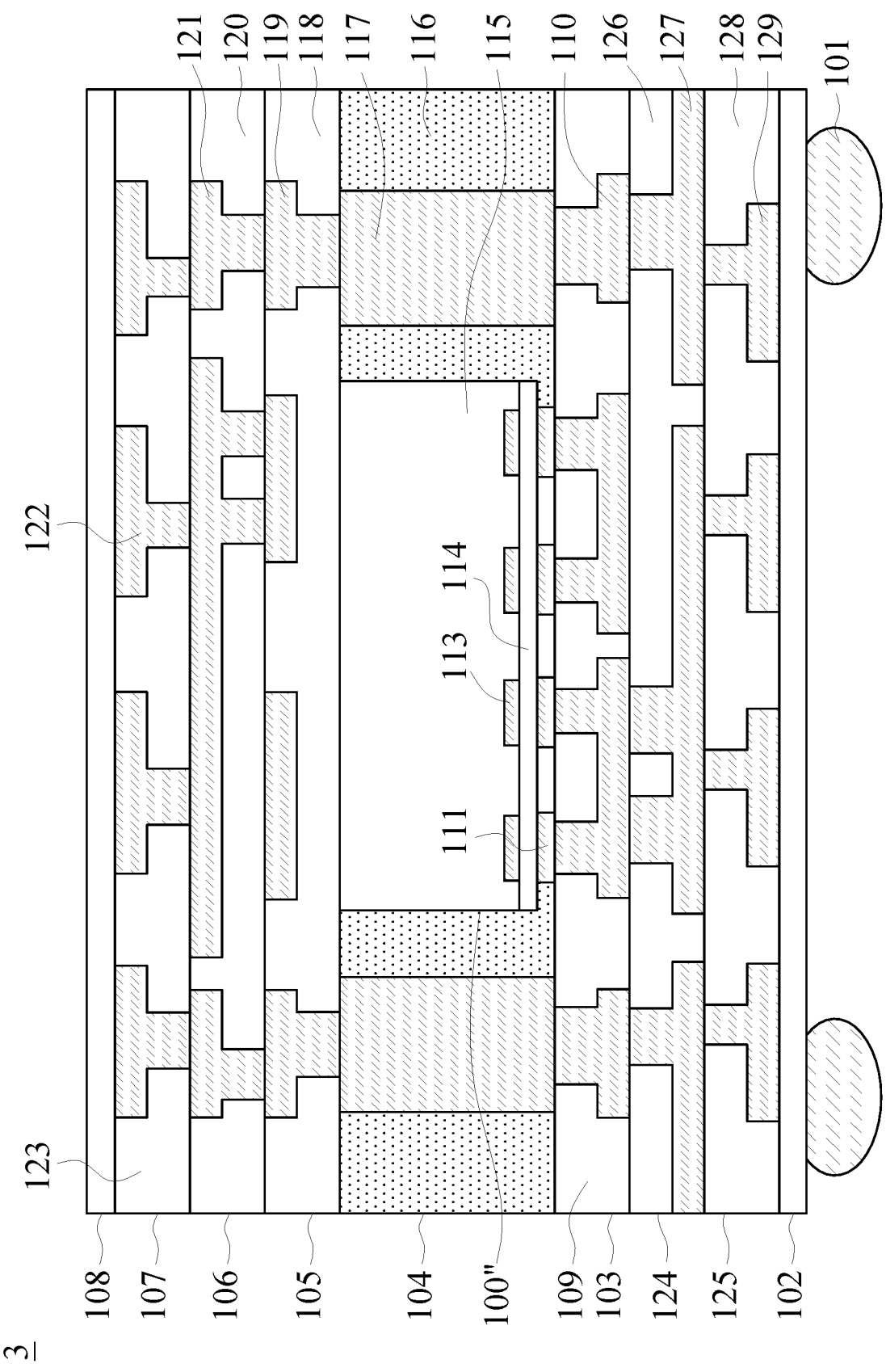
FIG. 5O is a product section view of a step of a method for manufacturing a multi-band antenna package structure according to another one embodiment of the present disclosure.

Next, in FIG. 5N, bump balls 101 are formed on the passivation layer 102, so as to form a second stacked structure. Next, the glue layer 404 and the temporary substrate 403 are removed, and the second stacked structure is faced down as shown in FIG. 5O. Refer to FIG. 5O, the multi-band antenna package structure 3 is formed, that can be mounted on a substrate through the bump balls 101

Figure 6:
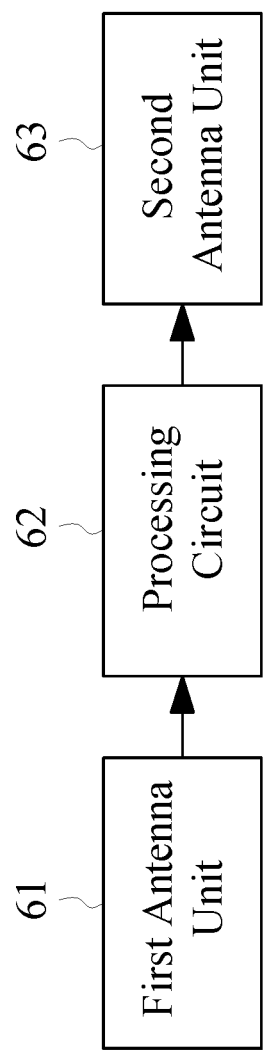
FIG. 6 is block diagram of a communication device using a multi-band antenna package structure according to one embodiment of the present disclosure.

Furthermore, referring to FIG. 6, FIG. 6 is block diagram of a communication device using a multi-band antenna package structure according to one embodiment of the present disclosure. A communication device 6 can be implemented by one of the above multi-band antenna package structures, wherein the integrated circuit is the processing circuit 62, and the two antenna units are first and second antenna units 61 and 63 respectively. Depending on the actual demand, the communication device 6 can be an encrypted communication device or a frequency conversion device, and the present disclosure is not limited thereto.

The first antenna unit 61 can be used to receive the first frequency signal. The processing circuit 62 comprises at least one of a filter, a modulator, a demodulator, an amplifier, an encoder, a decoder, an encryption circuit, a decryption circuit and so on, so as to process the first frequency signal. Then, the second antenna unit 63 outputs the second frequency signal according to the processed first frequency signal. If the communication device 6 is the frequency conversion device, the first frequency is not the same as the second frequency. If the communication device 6 is the encrypted communication device, the first frequency may be the same as or different from the second frequency.

In conclusion, the provided multi-band antenna package structure can integrate the radio frequency chip (having logic circuits and memories) and the antenna unit(s) in a stacked structure, so as to have advantages of high cost efficiency, high flexibility, high scalability, small volume, thin thickness and light weight. In addition, the antenna unit can be designed for elimination of different frequency band interferences, and be the antenna array for beamforming.

Furthermore, the provided multi-band antenna package structure can be used to implement a communication device for converting the frequency of the first frequency signal to generate the second frequency signal, such that the eavesdropper cannot eavesdrop the message information of the first frequency signal.

While the present disclosure has been described by means of specific embodiments, numerous modifications and variations could be made thereto by those skilled in the art without departing from the scope and spirit of the present disclosure set forth in the claims.

What is claimed is:

1. A method for manufacturing a multi-band antenna package structure, comprising:
    providing a first temporary substrate with a first glue layer;
    forming a first dielectric material layer on the first glue layer, and forming first metal patterns in openings of the first dielectric material layer;
    forming at least one metal via on one of the first metal patterns;
    forming at least one metal pillar on portions of the first metal patterns, and disposing an integrated circuit chip on the metal pillar;
    a molding layer is formed to cover the metal pillar, the metal via and the integrated circuit chip;
    thinning down the molding layer to expose the metal via, so as to form an integrated circuit chip layer comprising the molding layer, the metal via, the metal pillar and the integrated circuit chip;
    forming a first redistribution layer on the integrated circuit chip layer, wherein the first redistribution layer comprises a second dielectric material layer and second metal patterns, wherein the second patterns are formed in opening of the second dielectric material layer;
    forming a first antenna unit layer on the first redistribution layer, wherein the first antenna unit layer comprises a first dielectric layer and third metal patterns formed in openings of the first dielectric layer, wherein at least one of the third metal patterns is electrically connected to one of the second metal patterns, and the third metal patterns form a first antenna unit;
    forming a first protection layer on the first antenna unit layer, such that a first stacked structure is formed;
    removing the first temporary substrate with the first glue layer, and facing down the first stacked structure to adhere the first stacked structure on a second temporary substrate with a second glue layer;
    forming a second redistribution layer by processing the first dielectric material layer and the first metal patterns, wherein the second redistribution layer comprising the processed first dielectric material layer and the processed first metal patterns;
    forming a second protection layer on the second redistribution layer;
    forming bump balls on the second protection layer, such that a second stacked structure is formed; and
    removing the second temporary substrate with the second glue layer, facing down the second stacked structure, and mounting the second stacked structure on a substrate through the bump balls.

2. The method for manufacturing the multi-band antenna package structure according to claim 1, wherein the integrated circuit chip comprises a second antenna unit on an integrated circuit of the integrated circuit chip.

3. The method for manufacturing the multi-band antenna package structure according to claim 2, further comprising:
    before the first antenna unit layer is formed, forming a first shielding layer on the first redistribution layer, wherein the first shielding layer comprises a second dielectric layer and fourth metal patterns formed in openings of the second dielectric layer, wherein the fourth metal patterns are electrically connected to the third metal patterns and portions of the second metal patterns.

4. The method for manufacturing the multi-band antenna package structure according to claim 1, further comprising:
    before the second protection layer is formed, forming a second antenna unit layer on the second redistribution layer, wherein the second antenna unit layer comprises a second dielectric layer and fourth metal patterns formed in openings of the second dielectric layer, wherein at least one of the fourth metal patterns is electrically connected to one of the first metal patterns, and the fourth metal patterns form a first antenna unit.

5. The method for manufacturing the multi-band antenna package structure according to claim 4, further comprising:
    before the first antenna unit layer is formed, forming a first shielding layer on the first redistribution layer, wherein the first shielding layer comprises a third dielectric layer and fifth metal patterns formed in openings of the third dielectric layer, wherein the fifth metal patterns are electrically connected to the third metal patterns and portions of the second metal patterns; and before the second antenna unit layer is formed, forming a second shielding layer on the second redistribution layer, wherein the second shielding layer comprises a fourth dielectric layer and sixth metal patterns formed in openings of the fourth dielectric layer, wherein the sixth metal patterns are electrically connected to the fourth metal patterns and portions of the first metal patterns.

\* \* \* \* \*